United States Patent
Lin et al.

(10) Patent No.: US 12,266,653 B2
(45) Date of Patent: *Apr. 1, 2025

(54) SEMICONDUCTOR STRUCTURE AND METHODS OF FORMING THE SAME

(71) Applicant: TAIWAN SEMICONDUCTOR MANUFACTURING COMPANY, LTD., Hsinchu (TW)

(72) Inventors: Ta-Chun Lin, Hsinchu (TW); Kuo-Hua Pan, Hsinchu (TW); Jhon Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/225,114

(22) Filed: Jul. 22, 2023

(65) Prior Publication Data

US 2023/0361114 A1 Nov. 9, 2023

Related U.S. Application Data

(63) Continuation of application No. 17/381,435, filed on Jul. 21, 2021, now Pat. No. 11,749,677.
(Continued)

(51) Int. Cl.
*H01L 27/088* (2006.01)
*H01L 21/8234* (2006.01)

(52) U.S. Cl.
CPC .... *H01L 27/088* (2013.01); *H01L 21/823418* (2013.01); *H01L 21/823468* (2013.01); *H01L 21/823475* (2013.01)

(58) Field of Classification Search
CPC .......... H01L 27/088; H01L 21/823418; H01L 21/823468; H01L 21/823475;
(Continued)

(56) References Cited

U.S. PATENT DOCUMENTS 8,728,332 B2 5/2014 Lin et al.
8,796,666 B1 8/2014 Huang et al.
(Continued)

*Primary Examiner* — Karen Kusumakar
*Assistant Examiner* — Adam S Bowen
(74) *Attorney, Agent, or Firm* — NZ Carr Law Office

(57) ABSTRACT

A semiconductor structure includes a first semiconductor device formed over a substrate. The first semiconductor device includes a first source/drain feature over the substrate, a first gate structure over the substrate, a first conductive feature over the first source/drain feature, and a first insulation layer between the first gate structure and the first conductive feature, wherein the first insulation layer comprises a first contact etching stop layer (CESL) in contact with the first source/drain feature. The semiconductor structure includes a second semiconductor device formed over the substrate, including a second source/drain feature over the substrate, a second gate structure over the substrate, a second conductive feature over the second source/drain feature, and a second insulation layer between the second gate structure and the second conductive feature, the second insulation layer comprises a second CESL in contact with the second source/drain feature, wherein a thickness of the first CESL is less than a thickness of the second CESL.

20 Claims, 28 Drawing Sheets

Related U.S. Application Data

(60) Provisional application No. 63/175,017, filed on Apr. 14, 2021.

(58) Field of Classification Search
CPC ......... H01L 21/76831; H01L 21/76832; H01L 21/76897; H01L 29/165; H01L 29/7848; H01L 29/66545; H01L 21/823431; H01L 27/0886
See application file for complete search history.

(56) References Cited

U.S. PATENT DOCUMENTS

| | | |
|---|---|---|
| 8,822,243 B2 | 9/2014 | Yan et al. |
| 8,987,142 B2 | 3/2015 | Lee et al. |
| 9,093,530 B2 | 4/2015 | Huang et al. |
| 9,053,279 B2 | 6/2015 | Chang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 10,510,600 B1 | 12/2019 | Hsu et al. |
| 2017/0288031 A1 | 10/2017 | Ho et al. |
| 2018/0130704 A1* | 5/2018 | Li ..................... H01L 21/28052 |
| 2018/0151746 A1 | 5/2018 | Tu et al. |
| 2018/0337280 A1 | 11/2018 | Zhao |
| 2020/0058559 A1* | 2/2020 | Yoo ..................... H01L 29/6656 |

\* cited by examiner

SEMICONDUCTOR STRUCTURE AND METHODS OF FORMING THE SAME

CROSS-REFERENCE TO RELATED APPLICATIONS

This application is a continuation application of U.S. patent application Ser. No. 17/381,435 filed on Jul. 21, 2021, which claims a priority to a U.S. provisional application Ser. No. 63/175,017 filed on Apr. 14, 2021, both are incorporated by reference in its entirety.

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

However, the integrated fabrication also makes the adjustments of component characteristics among different devices further difficult. For example, the parasitic resistance and/or the parasitic capacitance of different devices are hard to be compromised among devices having different metal dimensions.

Therefore, there is a need in the art to provide an improved device that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
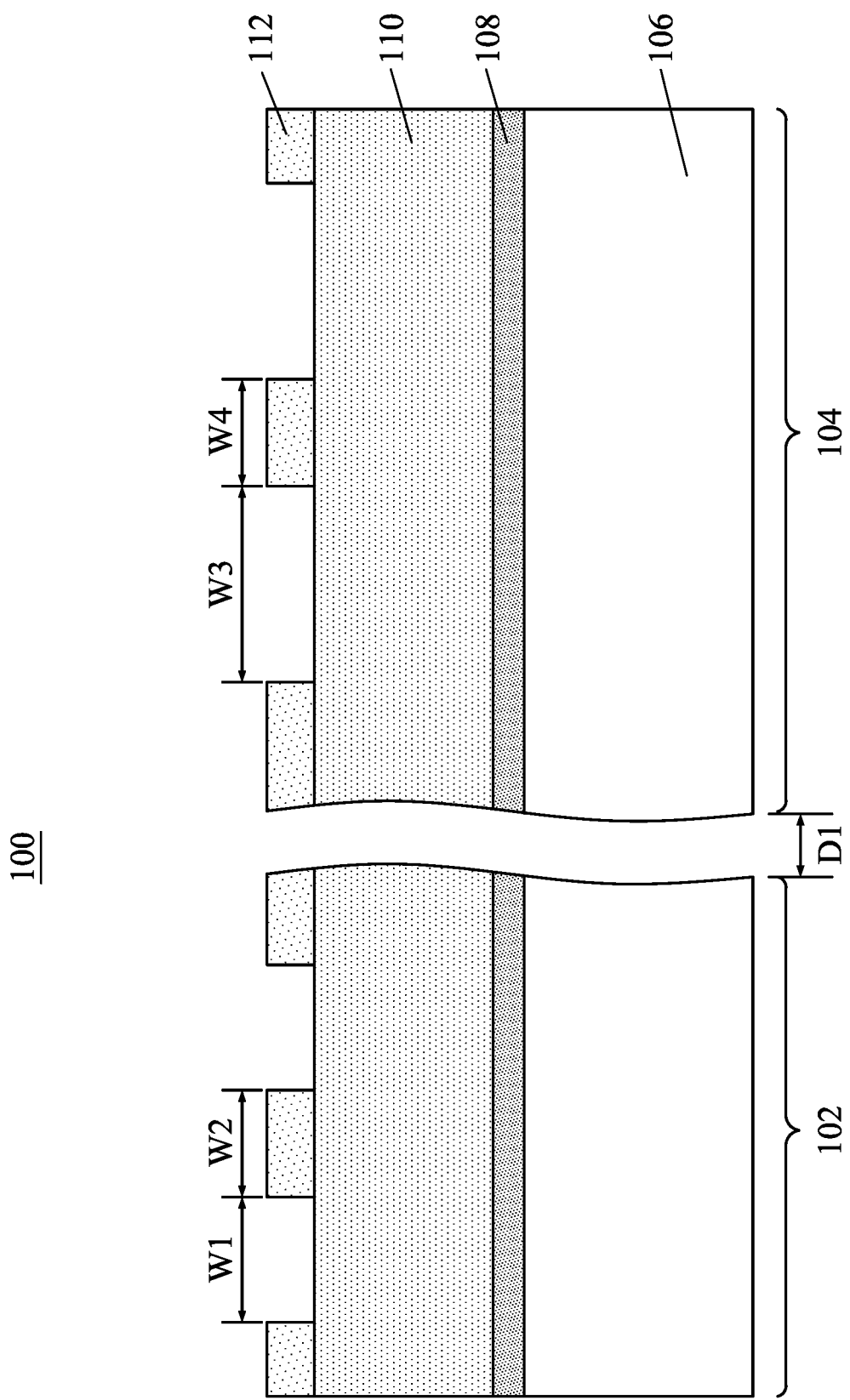
FIGS. 1-13 are cross-sectional side views of various stages of manufacturing a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-13 are cross-sectional side views of various stages of manufacturing a semiconductor structure 100, in accordance with some embodiments. Semiconductor structure 100 may be formed as various devices of an electronic component. For example, semiconductor structure 100 may be formed as transistors, diodes, imaging sensors, resistors, capacitors, inductors, memory cells, combinations thereof, and/or other suitable devices. In some embodiments, semiconductor structure 100 may be formed as the transistors, such as FinFET or nanostructure FET having a plurality of channels wrapped around by a gate electrode layer. Furthermore, in some embodiments, interconnection layers may be formed above or under semiconductor structure 100 and are designed to connect the various devices to form functional circuitry. The interconnection layers may be formed of alternating layers of dielectric (e.g., low-k dielectric material) having conductive material (e.g., copper) embedded therein, and the conductive material may be formed through any suitable process (such as deposition, damascene, dual damascene, or the like).

As shown in FIG. 1, semiconductor structure 100 includes a substrate 106, and a first region 102 and a second region 104 are defined on substrate 106. The first region 102 and the second region 104 may be separated from each other by a distance "D1", which may be any suitable distance depending on the application. While the first region 102 is shown adjacent to the second region 104 along a direction (e.g., X direction), the first region 102 may be located at different regions of the substrate 106 (e.g., at a different region along the Y direction perpendicular to the X direction). In some embodiments, first region 102 and second region 104 may be defined to form different components having different critical dimensions. First region 102 and second region 104 may be defined to form active and/or passive devices, such as transistors, capacitors, resistors, combinations of these and the like, that may be used to achieve the structural and functional requirements of the semiconductor device. For example, first region 102 may be used for fabricating transistors for SOC devices and second region 104 may be used for fabricating transistors for HPC devices.

Substrate 106 may be a semiconductor substrate, such as a bulk semiconductor, a semiconductor-on-insulator (SOI) substrate, or the like, which may be doped (e.g., with a p-type or an n-type dopant) or undoped. Substrate 106 may be a wafer, such as a silicon wafer. In some embodiments, the semiconductor material of substrate 106 may include silicon, germanium, a compound semiconductor including silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, and/or GaInAsP, or combinations thereof. In some embodiments, appropriate wells may be formed in substrate 106. For example, a P well may be formed in first region 102 of substrate 106, and an N well may be formed in second region 104 of substrate 106.

A dummy gate dielectric layer 108 and a dummy gate electrode layer 110 are formed on substrate 106. A hard mask 112 is formed on dummy gate electrode layer 110, and hard mask 112 is patterned based on the dummy gate electrode width and the gap to be formed between adjacent dummy gate electrodes. Dummy gate dielectric layer 108 may be formed by thermal oxidation, chemical vapor deposition (CVD), sputtering, or any other suitable methods for forming a gate dielectric. In some embodiments, dummy gate dielectric layer 108 may include dielectric materials having a high dielectric constant (k value), for example, greater than 3.9. Dummy gate dielectric layer 108 may include silicon nitrides, oxynitrides, metal oxides such as $HfO_2$, HfZrOx, HfSiOx, HfSiOx, HfAlOx, the like, or combinations and multi-layers thereof. Dummy gate electrode layer 110 may be formed over dummy gate dielectric layer 108 and may include a conductive material selected from a group comprising polycrystalline-silicon (polysilicon), poly-crystalline silicon-germanium (poly-SiGe), metallic nitrides, metallic silicides, metallic oxides, and metals. In some embodiments, amorphous silicon is deposited and recrystallized to create polysilicon. Dummy gate electrode layer 110 may be deposited by physical vapor deposition (PVD), CVD, sputter deposition, or other techniques known and used in the art for depositing conductive materials. After deposition, a top surface of dummy gate electrode layer 110 may have a non-planar top surface, and may be planarized, for example, by a chemical mechanical polishing (CMP) process, prior to patterning of dummy gate electrode layer 110. Hard mask 112 is formed over dummy gate electrode layer 110. Hard mask 112 may be made of SiN, SiON, $SiO_2$, the like, or a combination thereof. Hard mask 112 is then patterned, as shown in FIG. 1. For example, hard mask 112 in first region 102 is patterned based on a predetermined dummy gate structure width W2 and a gap W1 between adjacent dummy gate structures, and hard mask 112 in second region 104 is patterned based on a predetermined dummy gate structure width W4 and a gap W3 between adjacent dummy gate structures.

Figure 2:
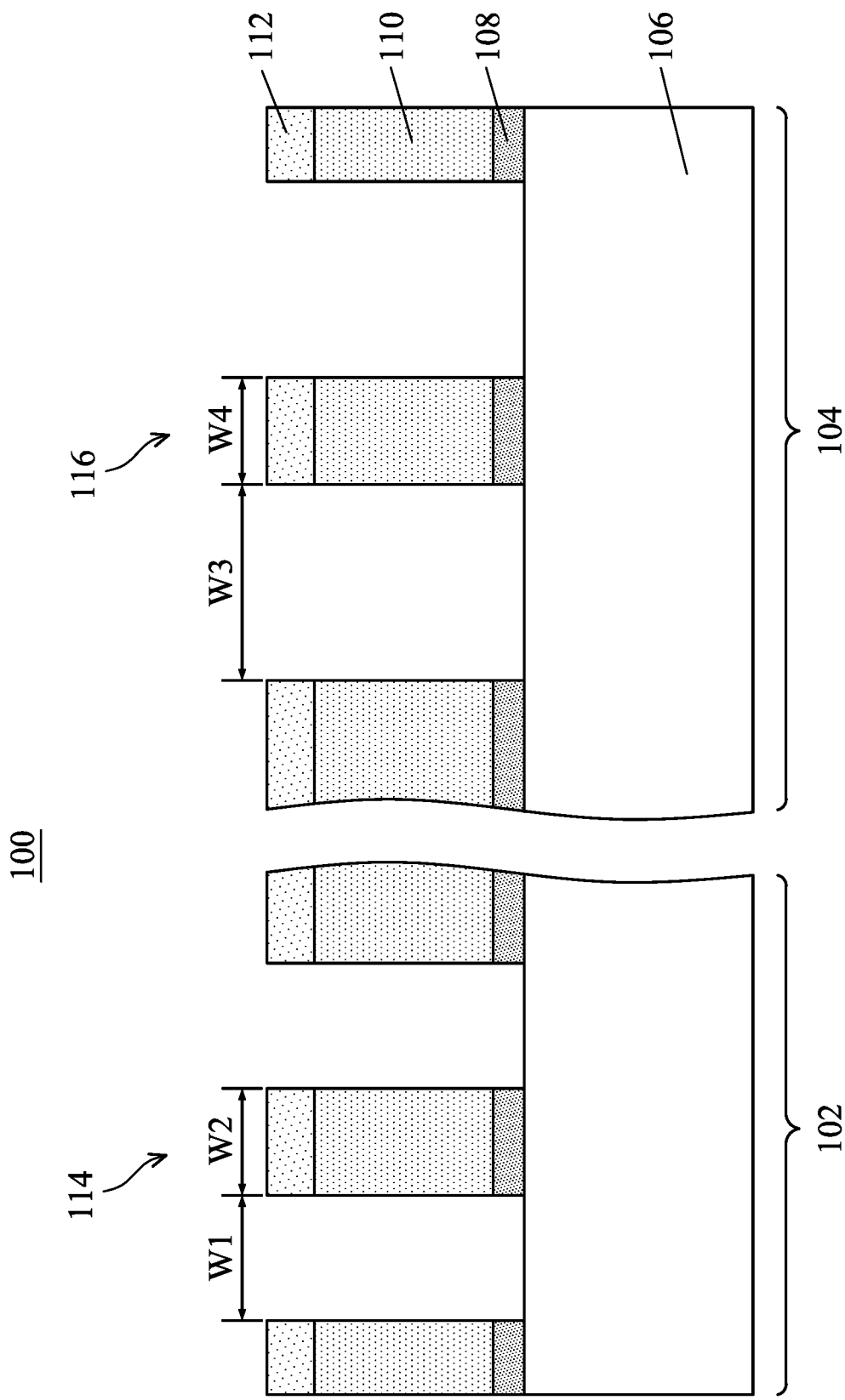

As shown in FIG. 2, dummy gate dielectric layer 108 and dummy gate electrode layer 110 are patterned to form first dummy gate structures 114 in first region 102 and second dummy gate structures 116 in second region 104, respectively. The dummy gate patterning process may be accomplished by using hard mask 112 as a mask and dummy gate dielectric layer 108 and dummy gate electrode layer 110 are etched to form first dummy gate structures 114 and second dummy gate structures 116. First dummy gate structures 114 has a width W2 and the gap between adjacent first dummy gate structures 114 is W1. Second dummy gate structures 116 has a width W4 and the gap between adjacent second dummy gate structures 116 is W3. In some embodiments, W2 is substantially equal to W4, and W1 is less than W3.

Figure 3:
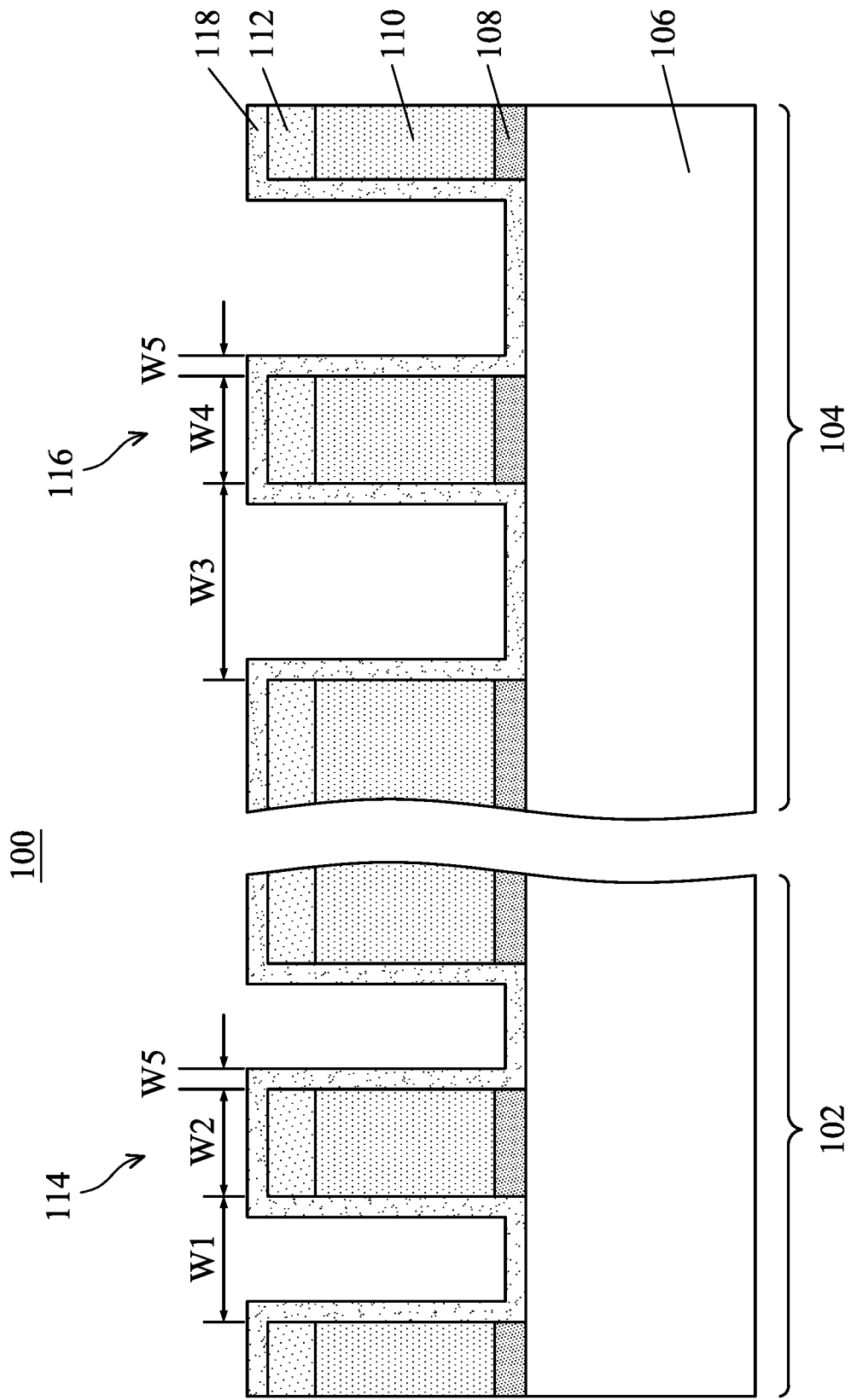

As shown in FIG. 3, a spacer layer 118 may be conformally formed on first dummy gate structures 114, second dummy gate structures 116, and substrate 106. Spacer layer 118 may be formed by blanket depositing on first dummy gate structures 114, second dummy gate structures 116, and substrate 106. In some embodiments, spacer layer 118 may include SiN, oxynitride, SiC, SiON, oxide, combinations thereof, or the like and may be formed by methods utilized to form such a layer, such as CVD, plasma enhanced CVD (PECVD), low pressure CVD (LPCVD), atomic layer deposition (ALD), sputter, the like, or a combination thereof. Spacer layer 118 formed in first region 102 and second region 104 may substantially have a same thickness W5.

Figure 4:
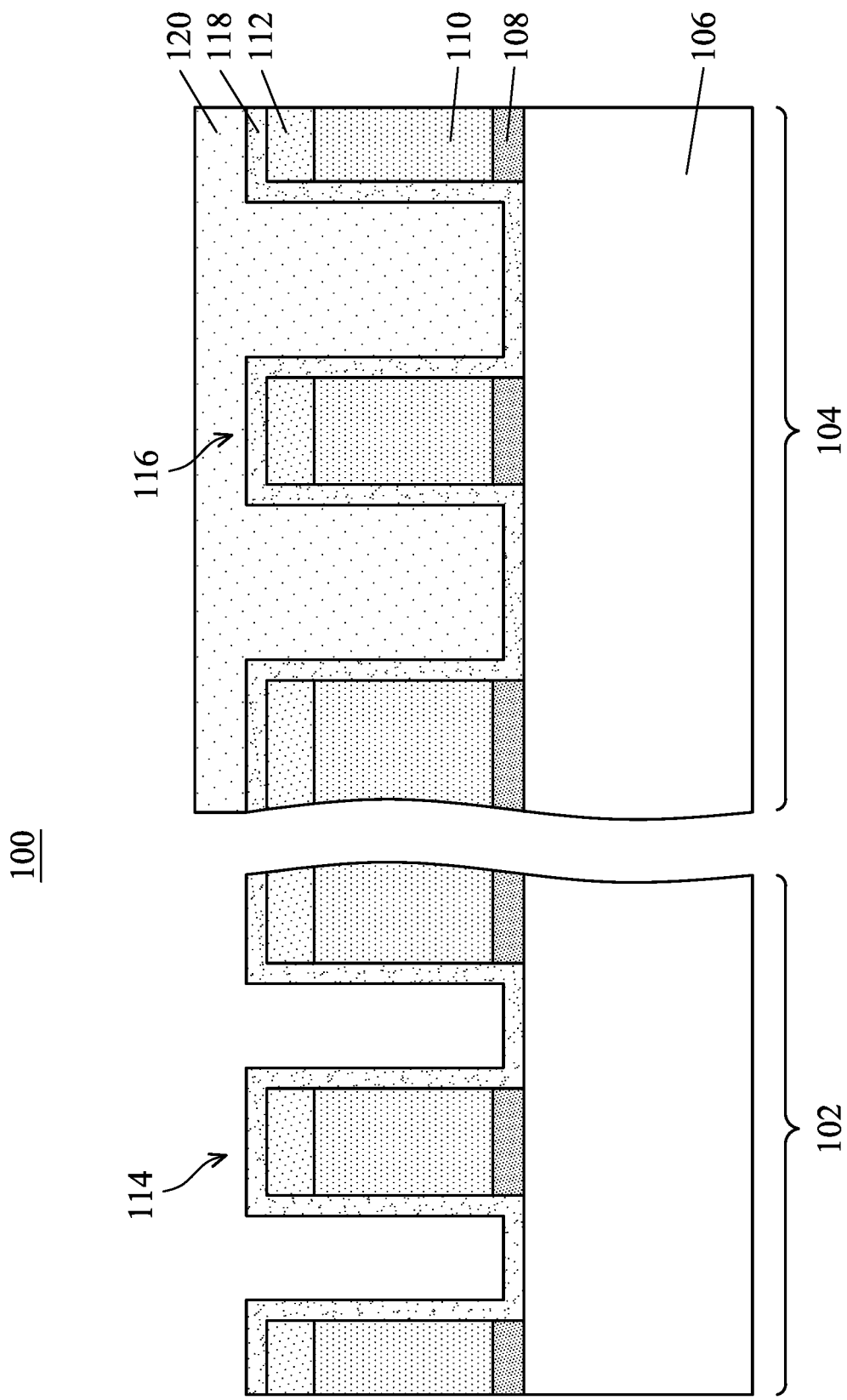
Figure 5:
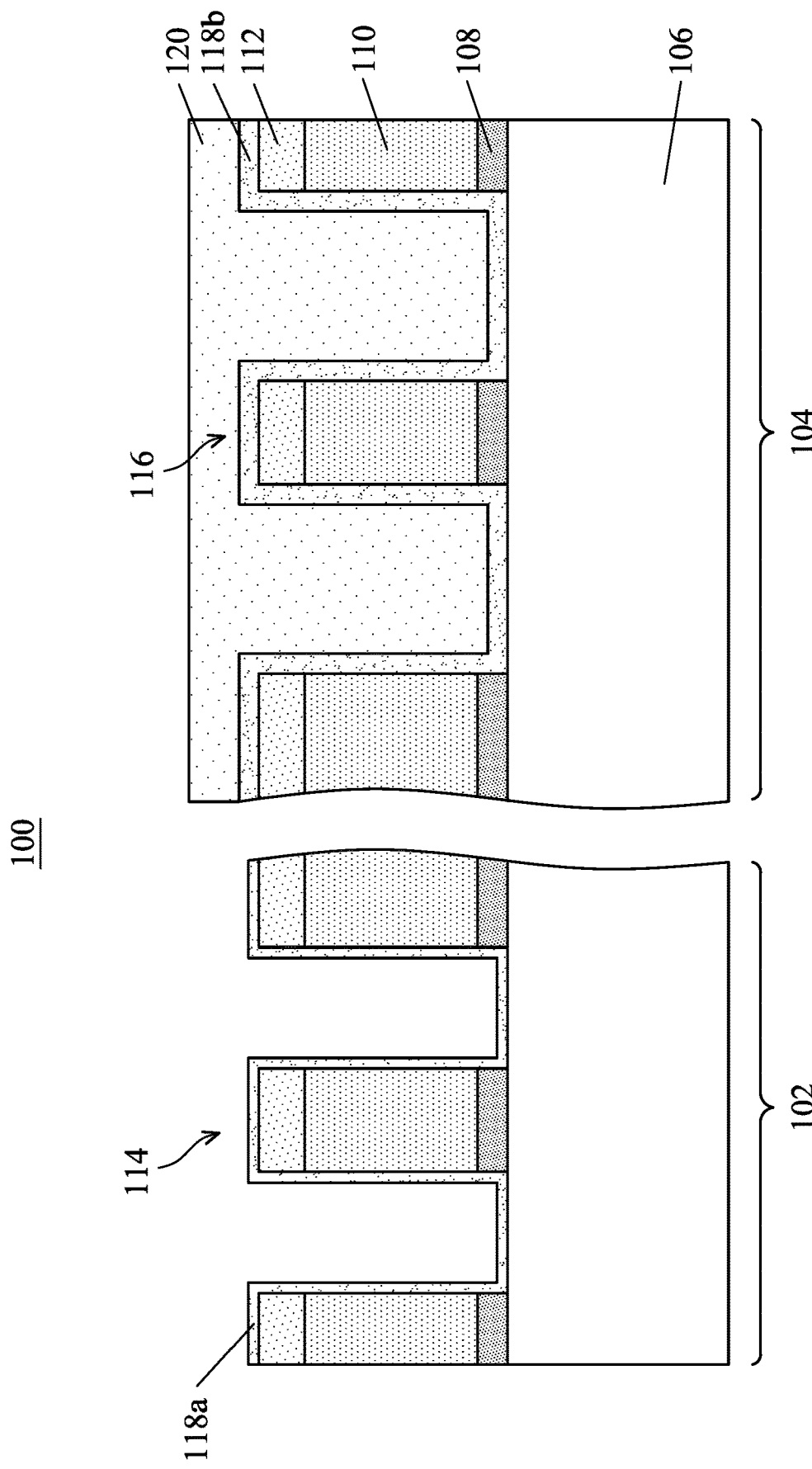

As shown in FIG. 4, a protection layer 120 is formed over spacer layer 118 in second region 104. In some embodiments, protection layer 120 may be a photoresist or other suitable materials that can protect spacer layer 118 during the etch process. Then, as shown in FIG. 5, a thinning operation is performed on spacer layer 118. Since spacer layer 118 in second region 104 is covered by protection layer 120, only spacer layer 118 in first region 102 is thinned. The thinning operation of spacer layer 118 may be performed by dry etch, wet etch, or other suitable processes.

Figure 6:
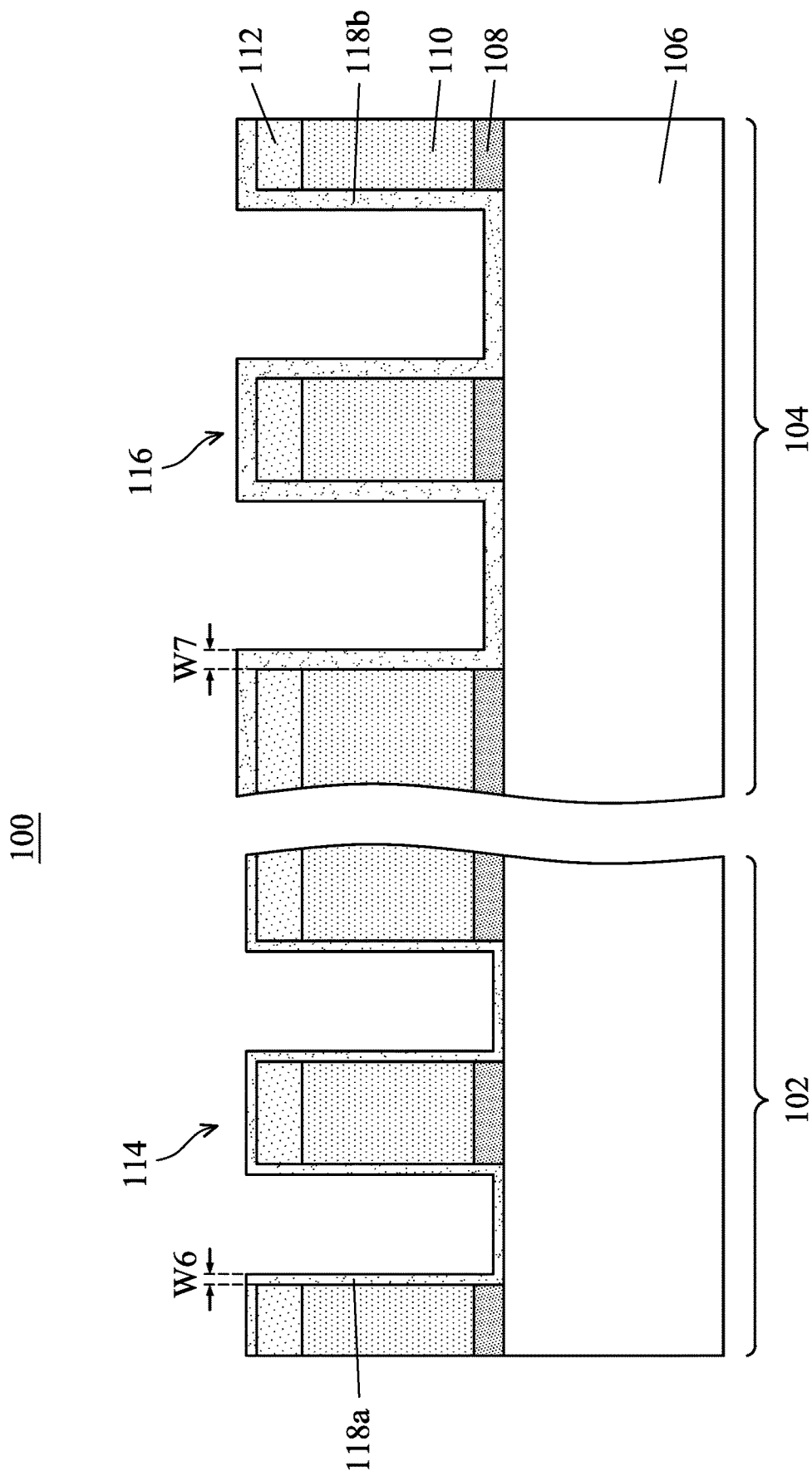

As shown in FIG. 6, protection layer 120 is removed. Spacer layer 118a in first region 102 has a thickness W6, and spacer layer 118b in second region 104 has a thickness W7. W6 is less than W7. By covering or uncovering spacer layer 118 in different regions of semiconductor structure 100 and performing the thinning operation, the thickness of spacer layer 118 can be controlled to achieve the predetermined parasitic resistance and/or parasitic capacitance of different devices formed on different regions of semiconductor structure 100.

Figure 7:
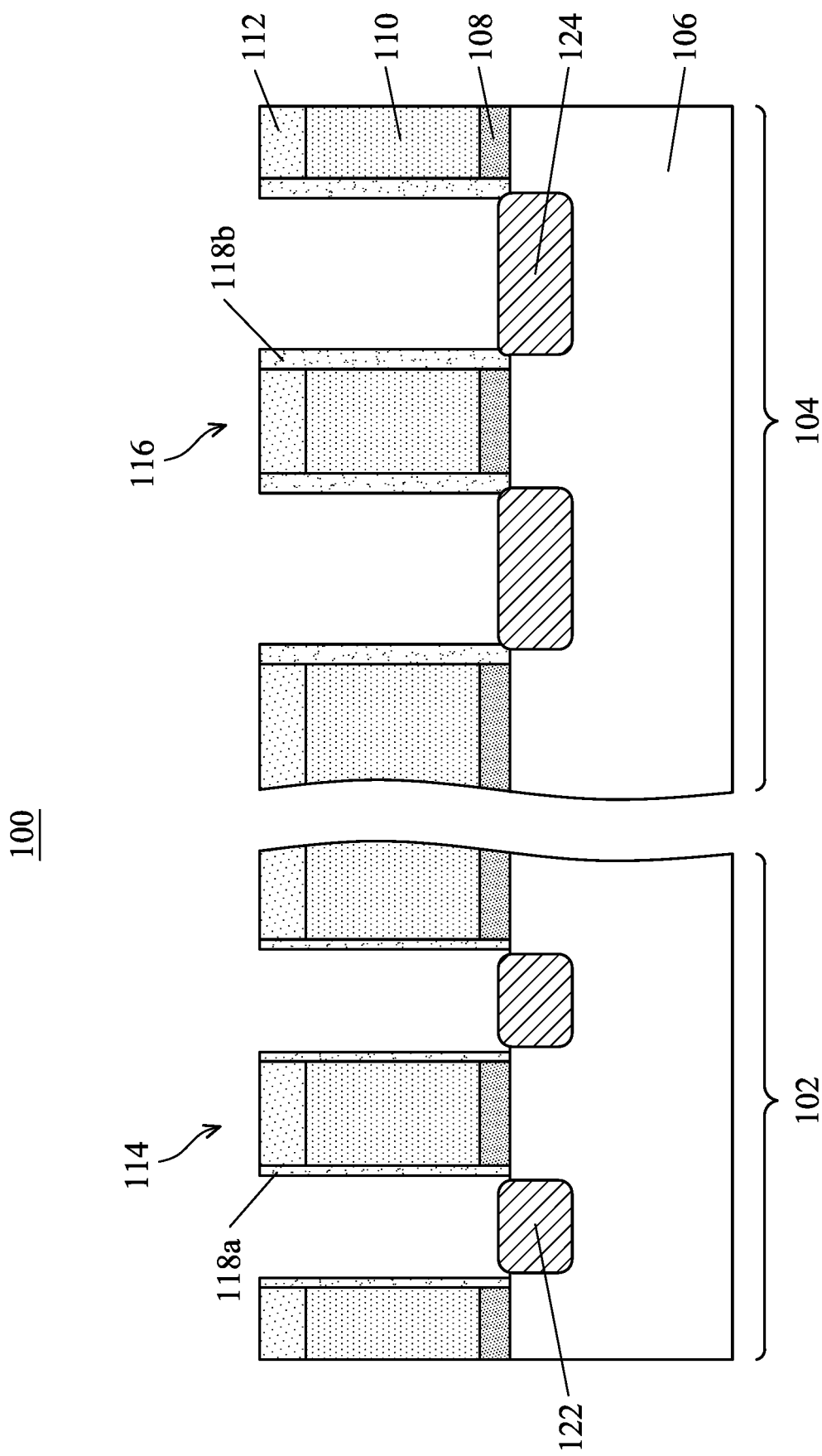

As shown in FIG. 7, spacer layer 118a and spacer layer 118b are patterned, for example, by an anisotropic etch to remove spacer layer 118a and spacer layer 118b from horizontal surfaces, such as top surfaces of first dummy gate structures 114 and second dummy gate structures 116 as well as top surfaces of substrate 106. Then, a first source/drain feature 122 and a second source/drain feature 124 are formed in substrate 106 on opposite sides of the first dummy gate structures 114 and second dummy gate structures 116, respectively. First source/drain feature 122 and second source/drain feature 124 may be formed by performing an implanting process to implant appropriate dopants in substrate 106. In some embodiments, first source/drain feature 122 and second source/drain feature 124 may be formed by forming recesses in substrate 106 and epitaxially growing material in the recesses.

First source/drain feature 122 and second source/drain feature 124 may be doped either through an implantation method as described above, or by in-situ doping as the material is grown. In some embodiments, first source/drain feature 122 and second source/drain feature 124 may include any suitable materials, such as appropriate for n-type FETs and/or p-type FETs. For example, in an n-type configuration, if substrate 106 is silicon, first source/drain feature 122 and second source/drain feature 124 may include silicon, SiC, SiCP, SiP, or the like. For another example, in an n-type configuration, if substrate 106 is silicon, first source/drain feature 122 and second source/drain feature 124 may comprise SiGe, SiGeB, Ge, GeSn, or the like. First source/drain feature 122 and second source/drain feature 124 may have surfaces raised above top surfaces of substrate 106 and may have facets.

In some embodiments, first source/drain feature 122 and second source/drain feature 124, and the gate structures formed later may form transistors, such as metal-oxide-semiconductor FETs (MOSFETs). In some embodiments, the MOSFETs may be configured in a PMOS or an NMOS configuration. In a PMOS configuration, substrate 106 may be doped with n-type dopants and first source/drain feature 122 and second source/drain feature 124 may be doped with p-type dopants. In an NMOS configuration, substrate 106 may be doped with p-type dopants and first source/drain feature 122 and second source/drain feature 124 may be doped with n-type dopants.

Figure 8:
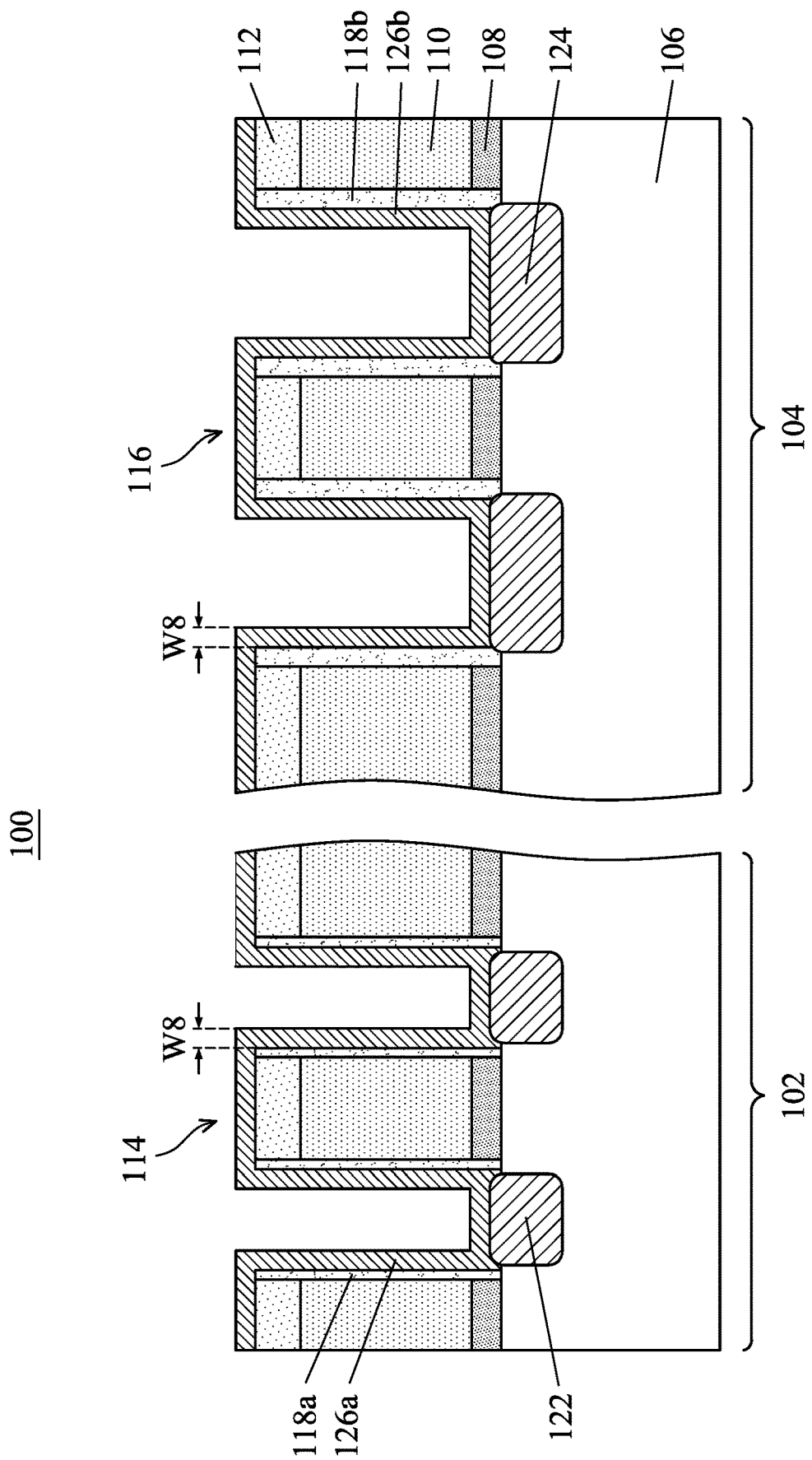

As shown in FIG. 8, a contact etching stop layer (CESL) 126, including CESL 126a and CESL 126b, is conformally formed over first dummy gate structures 114, second dummy gate structures 116, spacer layer 118a, spacer layer 118b, first source/drain feature 122, and second source/drain feature 124. CESL 126a in first region 102 and CESL 126b in second region 104 may be formed by the same process. In some embodiments, CESL 126a in first region 102 and CESL 126b in second region 104 may substantially have a same thickness W8. In some embodiments, CESL 126a and CESL 126b may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof.

Figure 9:
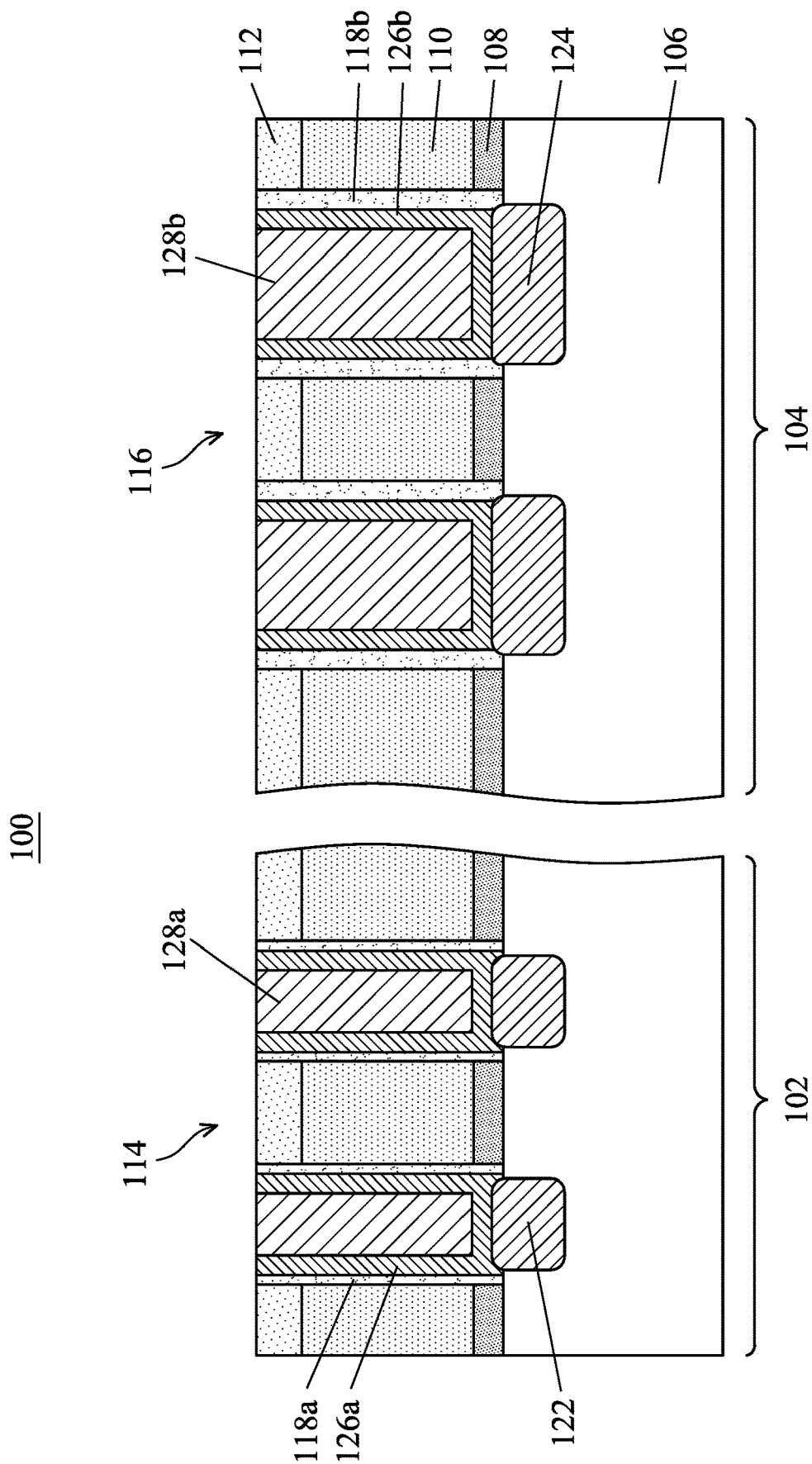

As shown in FIG. 9, an interlayer dielectric (ILD) 128 is deposited over CESL 126, including CESL 126a and CESL 126b, and a planarization process is performed to remove the top portions of ILD 128 to form ILD 128a in first region 102 and ILD 128b in second region 104. In some embodiments, ILD 128 (ILD 128a and ILD 128b) is a flowable film formed by a flowable CVD. In some embodiments, ILD 128 is formed of oxides such as silicon oxide, Phospho-Silicate Glass (PSG), Boro-Silicate Glass (BSG), Boron-Doped Phospho-Silicate Glass (BPSG), undoped Silicate Glass (USG), low-k dielectrics such as carbon doped oxides, extremely low-k dielectrics such as porous carbon doped silicon dioxide, a polymer such as polyimide, the like, or a combination thereof. The low-k dielectric materials may have a k value lower than 3.9. ILD 128 may be deposited by any suitable method such as by CVD, ALD, a spin-on-dielectric (SOD) process, the like, or a combination thereof. The planarization process, such as a CMP process, may be performed to level the top surface of ILD 128 with top surfaces of first dummy gate structures 114 and second dummy gate structures 116 and top surfaces of CESL 126a and 126b. In some embodiments, the CMP process may also remove hard mask 112.

Figure 10:
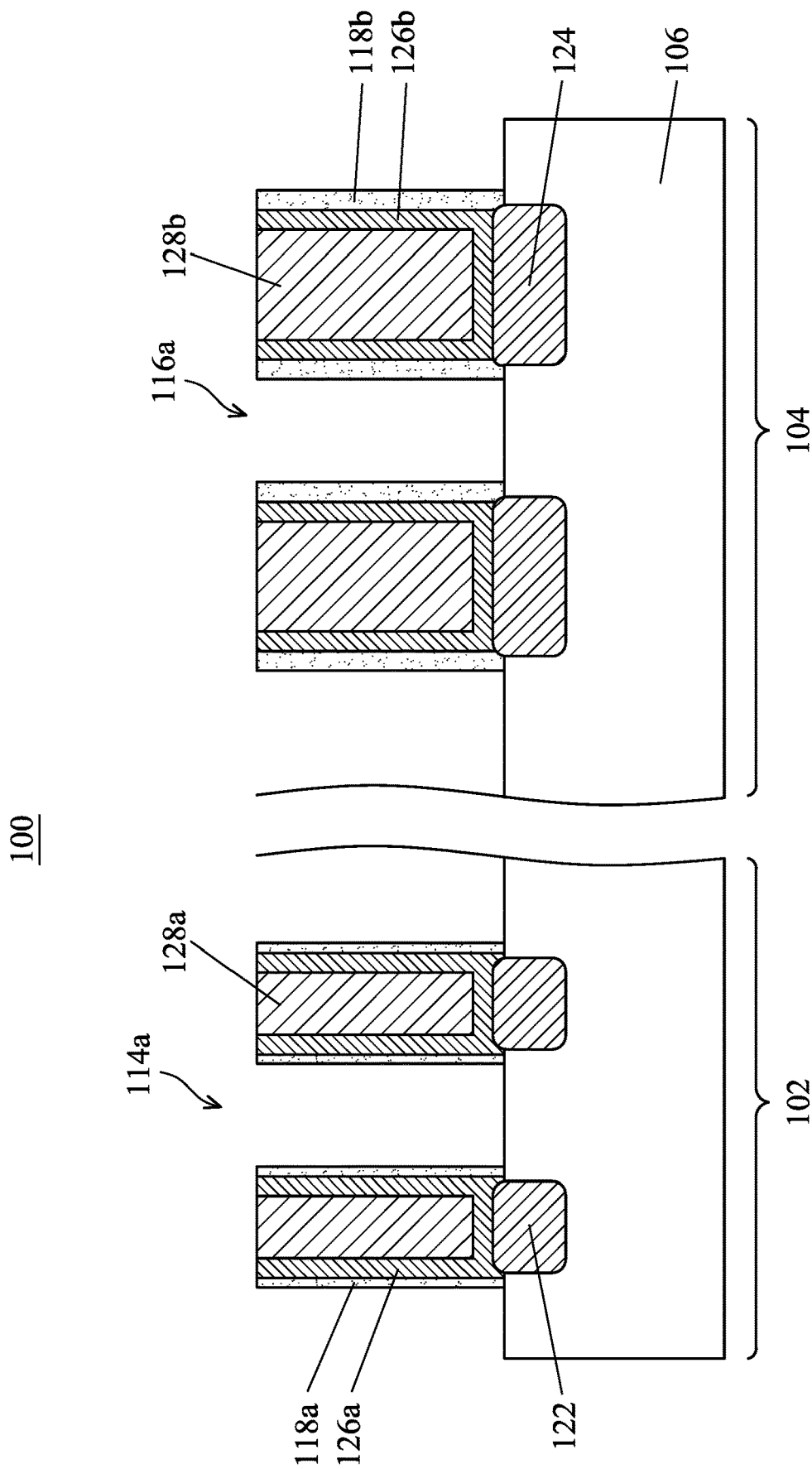

As shown in FIG. 10, first dummy gate structures 114 and second dummy gate structures 116 are removed. Dummy gate dielectric layer 108 and dummy gate electrode layer 110 may be removed in one or multiple etch operations, so that recesses 114a and 116a are formed. Each recess 114a or 116a exposes a channel region of a respective FET. Each channel region is disposed between neighboring pairs of first source/drain feature 122 and second source/drain feature 124. During the removal, dummy gate dielectric layer 108 may be used as an etch stop layer when first dummy gate structures 114 and second dummy gate structures 116 are etched. Dummy gate dielectric layer 108 may then be removed after the removal of dummy gate electrode layer 110. The recesses 114a and 116a are defined by the exposed surfaces of substrate 106 and exposed surfaces of spacer layer 118a and spacer layer 118b.

Figure 11:
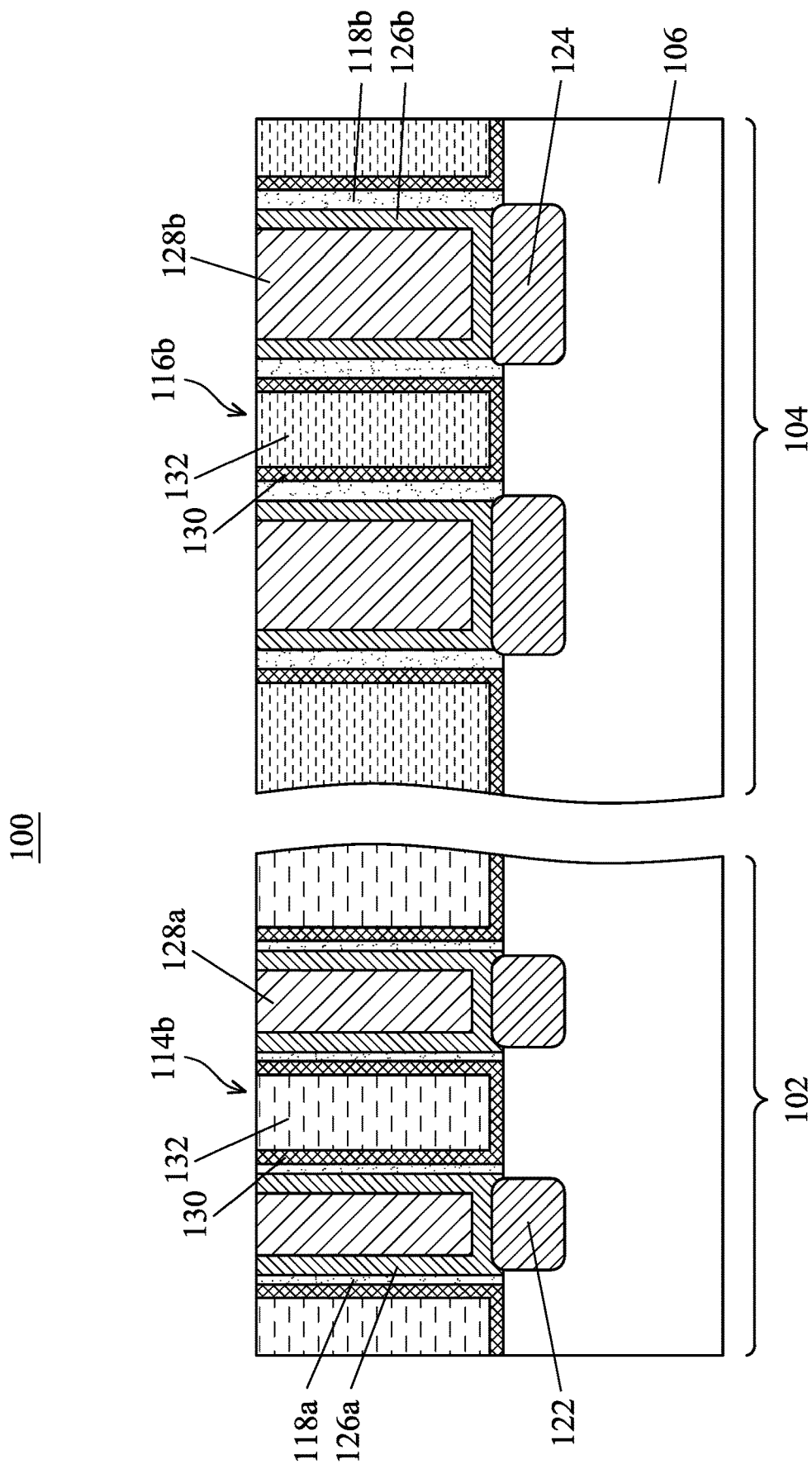

As shown in FIG. 11, first gate structures 114b and second gate structures 116b are formed in recesses 114a and 116a. Gate dielectric layers 130 and gate electrodes 132 are formed as replacement gates. Gate dielectric layers 130 are deposited conformally in recesses 114a and 116a, such as on the top surface of substrate 106 and on sidewalls of spacer layers 118a and 118b, and on a top surface of ILD 128a and ILD 128b. In some embodiments, gate dielectric layers 130 may include silicon oxide, silicon nitride, or multilayers thereof. In other embodiments, gate dielectric layers 130 may include a high-k dielectric material. In some embodiments, gate dielectric layers 130 may have a k value greater than about 7.0, and may include a metal oxide or a silicate of Hf, Al, Zr, La, Mg, Ba, Ti, Pb, and combinations thereof. The gate dielectric layers 130 may be formed by any suitable technique such as molecular-beam deposition (MBD), ALD, PECVD, or the like.

Then, gate electrodes 132 are deposited over gate dielectric layers 130, and fill the remaining portions of recesses 114a and 116a. Gate electrodes 132 may be made of a metal-containing material such as TiN, TaN, TaC, Co, Ru, Al, combinations thereof, or multi-layers thereof. After filling of gate electrodes 132, a planarization process, such as a CMP process, may be performed to remove the top portions of gate dielectric layers 130 and gate electrodes 132, which excess over the top surface of ILD 128a and 128b.

Figure 12:
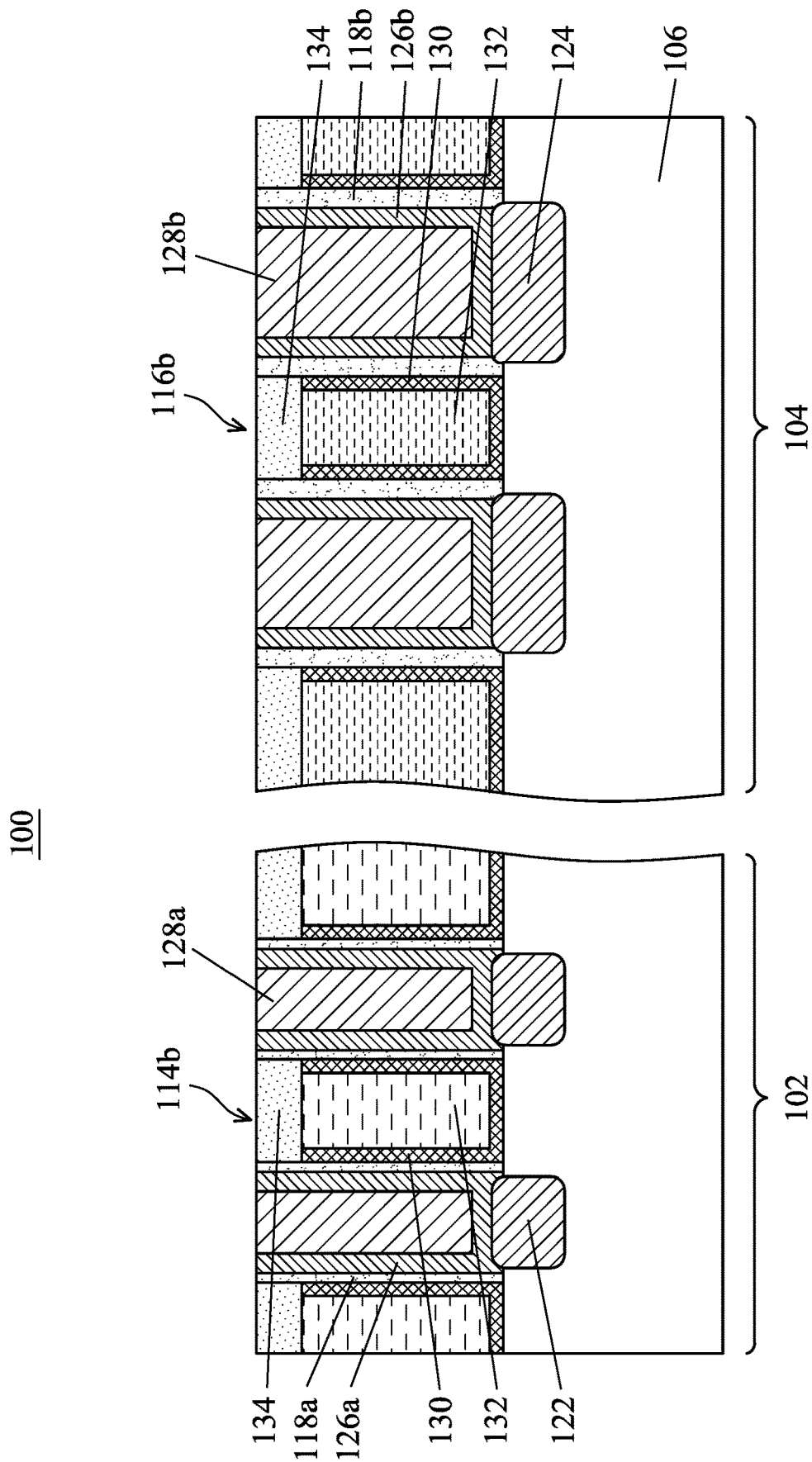

As shown in FIG. 12, a hard mask layer 134 is formed on each of first gate structures 114b and second gate structures 116b. In some embodiments, first gate structures 114b and second gate structures 116b may be recessed in one or multiple etch operations to form recesses on the top of first gate structures 114b and second gate structures 116b. Hard mask layer 134 is then formed within the recesses to protect first gate structures 114b and second gate structures 116b. The bottom surfaces of the recesses may have a flat surface as illustrated in FIG. 12, a convex surface, a concave surface, or a combination thereof. First gate structures 114b and second gate structures 116b may be recessed by any suitable processes, such as one that is selective to the materials of gate dielectric layers 130 and gate electrodes 132.

Hard mask layer 134 may be made of a metal, a metal oxide, a metal nitride, pure silicon, the like, or a combination thereof. For example, hard mask layer 134 may be made of SiN, SiON, SiO2, the like, or a combination thereof. In some embodiments, hard mask layer 134 may be formed by CVD, PVD, ALD, a spin-on-dielectric process, the like, or a combination thereof. A planarization process, such as a CMP process, may be performed to level the top surface of ILD 128a and 128b with the top surfaces of hard mask layer 134. Hard mask layer 134 provides protection for first gate structures 114b and second gate structures 116b during the subsequent self-aligned contact etching processes to ensure that the self-aligned contact does not form a short circuit between one of first gate structures 114b and second gate structures 116b and the corresponding first source/drain feature 122 or second source/drain feature 124.

Figure 13:
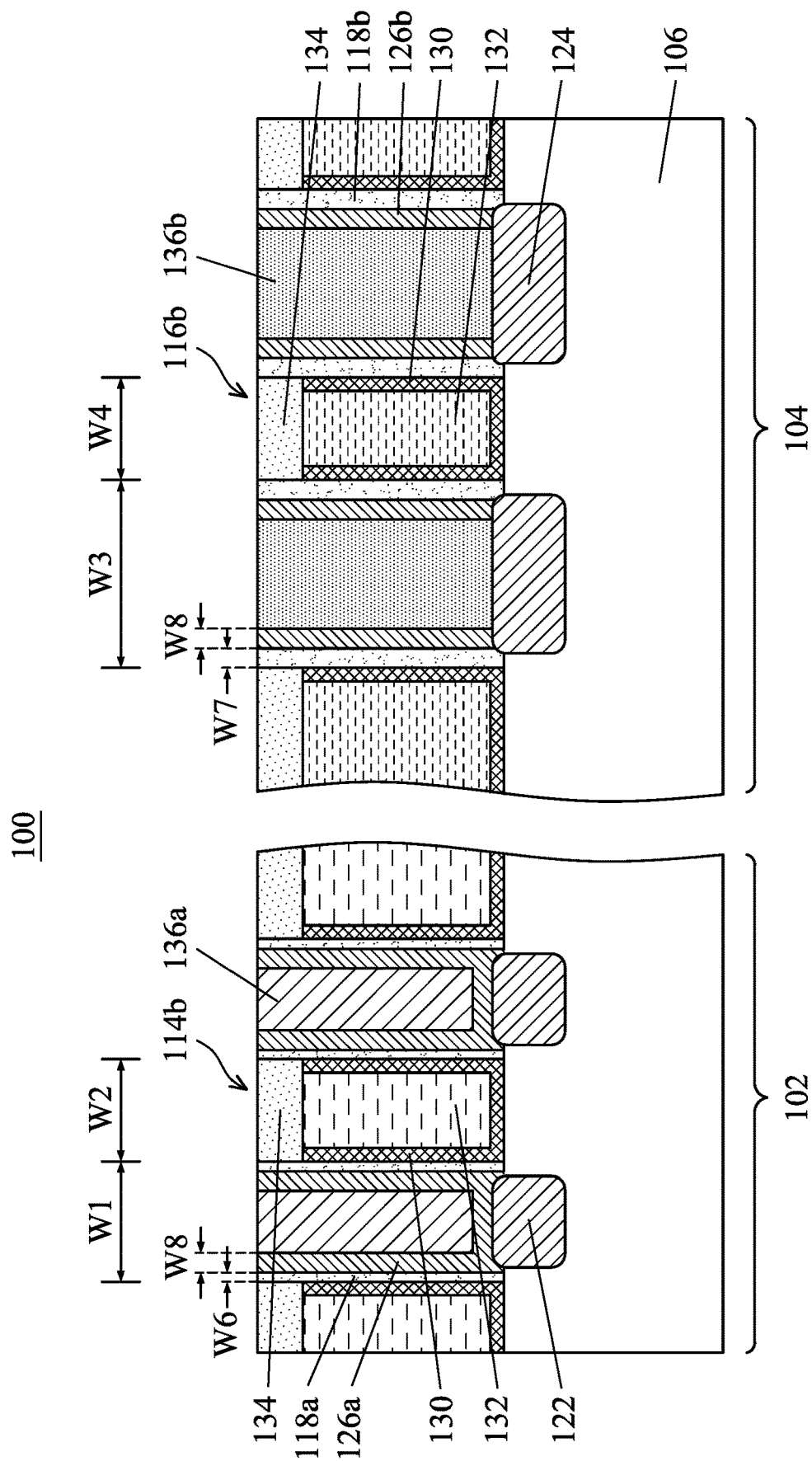

As shown in FIG. 13, ILD 128a and ILD 128b are removed to form an opening exposing first source/drain feature 122 and second source/drain feature 124, respectively. ILD 128a and ILD 128b may be removed by wet etch, dry etch, or other suitable etch processes, e.g., anisotropic dry etch processes.

First conductive features 136a and second conductive features 136b are then formed in the openings after the removal of ILD 128a and ILD 128b. First conductive feature 136a contacts first source/drain feature 122 and second conductive feature 136b contacts second source/drain feature 124. In some embodiments, first conductive features 136a and second conductive features 136b may further include a barrier layer (not shown). First conductive features 136a and second conductive features 136b may be made of tungsten, copper, aluminum, or other suitable materials. First conductive features 136a and second conductive features 136b may be formed through a deposition process such as electrochemical plating, PVD, CVD, the like, or a combination thereof. In some embodiments, first conductive features 136a and second conductive features 136b may be planarized by a grinding process such as a CMP process.

FIG. 13 illustrates the thickness relationship of various layer in first region 102 and second region 104 of semiconductor structure 100. The width of first gate structure 114b is W2 and the width of second gate structure 116b is W4, which are defined by the width of first dummy gate structures 114 and second dummy gate structures 116, as shown in FIG. 2. In some embodiments, W2 is substantially equal to W4. The thickness of CESL 126a is W8 and the thickness of CESL 126b is substantially equal to that of CESL 126a, because CESL 126a and CESL 126b are formed in a same process.

Spacer layer 118a in first region 102 has a thickness W6, and spacer layer 118b in second region 104 has a thickness W7. Since spacer layer 118a has been performed a thinning operation, the thickness of spacer layer 118a (W6) is less than the thickness of spacer layer 118b (W7). Gap W1 between adjacent first gate structures 114b is less than gap W3 between adjacent second gate structures 116b. In some embodiments, W1 is about 60% to about 90% of W3, which may vary depending on different devices fabricated in first region 102 and second region 104 on the same substrate 106. In some embodiments, W1 is about 65% to about 80% of W3.

The width of the source/drain contacts, e.g., first conductive features 136a and second conductive features 136b, may be defined by the gap between adjacent gate structures and the insulation layers, e.g., spacer layer 118a, spacer layer 118b, CESL 126a and CESL 126b. For example, the width of first conductive features 136a may be substantially equal to (W1−2*(W6+W8)), and the width of second conductive features 136b may be substantially equal to (W3−2*(W7+W8)). In general, the larger the width of the first/second conductive features 136a, 136b, the lower the parasitic contact resistance (Rp) associated with the first/second conductive features 136a, 136b. A higher parasitic contact resistance can limit the operation of the devices and reduce performance. In some embodiments, the devices formed in first region 102 may need to reduce the parasitic resistance and increase the parasitic capacitance between first gate structure 114b and first conductive features 136a, comparing to the parasitic resistance and the parasitic capacitance between second gate structure 116b and second conductive features 136b. For example, when SOC devices are formed in first region 102 and HPC devices are formed in second region 104, a characteristic of low parasitic resistance and high parasitic capacitance between first gate structure 114b and first conductive features 136a may be beneficial.

By covering spacer layer 118 in second region and thinning spacer layer 118 in first region 102 to form spacer layer 118a, spacer layer 118b, the thickness W6 of spacer layer 118a can be controlled to be less than the thickness W7 of spacer layer 118b. Hence, the total thickness of the insulation layer in first region 102, including spacer layer 118a and CESL 126a, could be controlled thinner than the total thickness of the insulation layer in second region 104, including spacer layer 118b and CESL 126b. The parasitic resistance between first gate structure 114b and first conductive features 136a is therefore less than the parasitic resistance between second gate structure 116b and second conductive features 136b, and the parasitic capacitance between first gate structure 114b and first conductive features 136a is therefore higher than the parasitic capacitance between second gate structure 116b and second conductive features 136b.

Furthermore, as first gate structure 114b and second gate structure 116b are formed during the same processes, and first conductive features 136a and second conductive features 136b are formed during the same processes, the steps for forming different devices having different insulation layer thickness in different regions of the same substrate can be further simplified as well. When first gate structure 114b and second gate structure 116b include a self-aligned contact (SAC), such as hard mask layer 134, the devices having different critical dimensions can be formed at the same time to have the insulation layers with different thickness. Hence, the parasitic resistance and parasitic capacitance between devices using SAC process could be optimized, and the devices having large process window is not limited to compromise with the devices having small process window.

Figure 14:
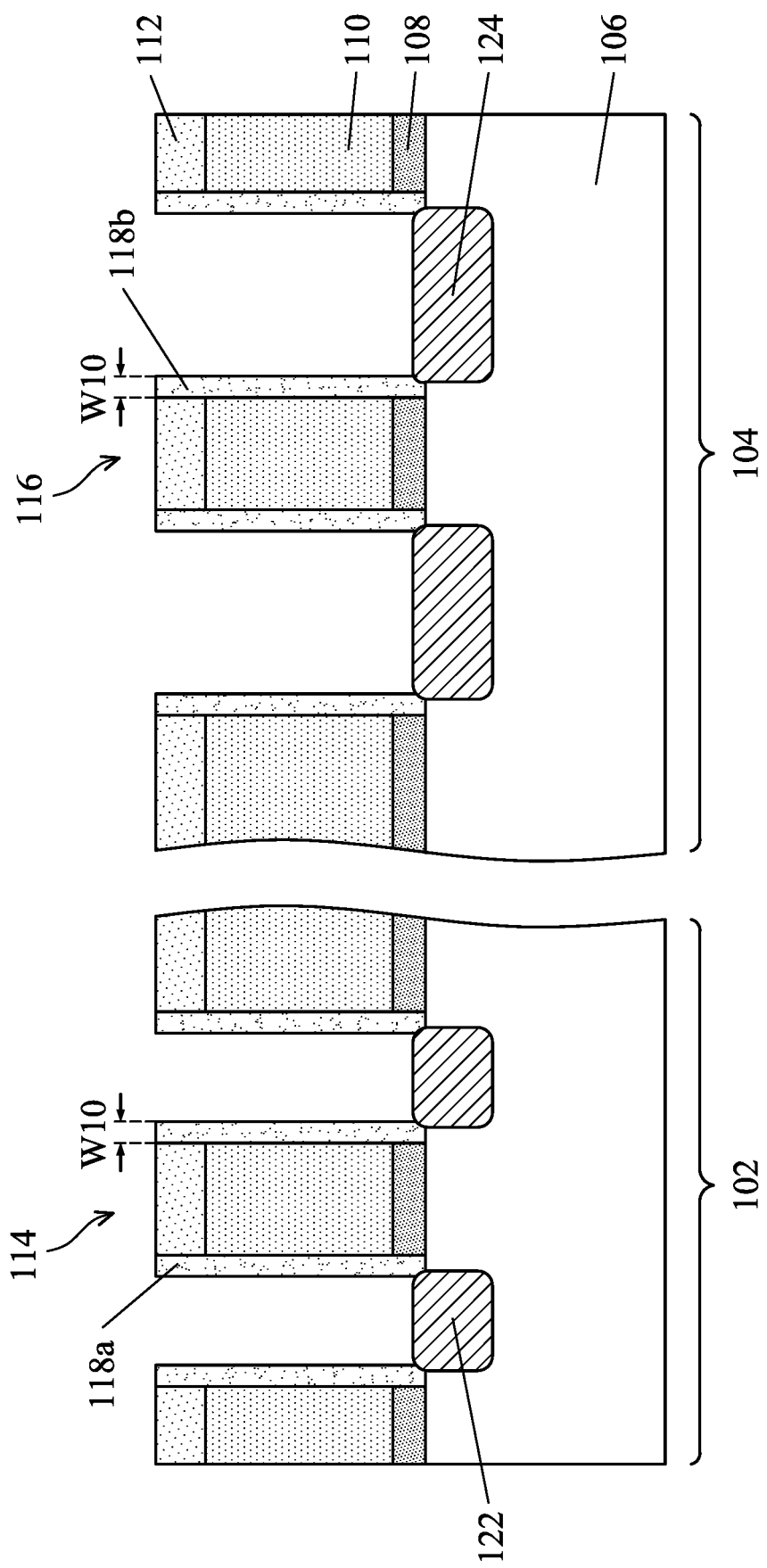
FIGS. 14-22 are cross-sectional side views of various stages of manufacturing another semiconductor structure, in accordance with some embodiments.

FIGS. 14-22 are cross-sectional side views of various stages of manufacturing another semiconductor structure 200, in accordance with some embodiments. Semiconductor structure 200 is similar to semiconductor structure 100 except the thickness of the spacer layers in first region 102 and second region 104 are substantially the same, and the thickness of the CESLs in first region 102 and second region 104 are different. As shown in FIG. 14, first dummy gate structures 114 are formed in first region 102 and second dummy gate structures 116 are formed in second region 104.

Spacer layer 118 (118a, 118b) is conformally formed on first dummy gate structures 114, second dummy gate structures 116, and substrate 106. Then, portions of spacer layer 118 are patterned, for example, by an anisotropic etch to remove spacer layer 118 from horizontal surfaces, such as top surfaces of first dummy gate structures 114 and second dummy gate structures 116 and top surfaces of substrate 106 to form spacer layer 118a in first region 102 and spacer layer 118b in second region 104. First source/drain feature 122 and second source/drain feature 124 are formed in substrate 106. The processes for forming the structures shown in FIG. 14 may be similar to the operations shown in FIGS. 1-7, but spacer layer 118a in first region 102 in FIG. 14 are not thinned, comparing to spacer layer 118b in second region 104. The thickness of spacer layer 118a is W10, and the thickness of spacer layer 118b may be substantially equal to W10.

Figure 15:
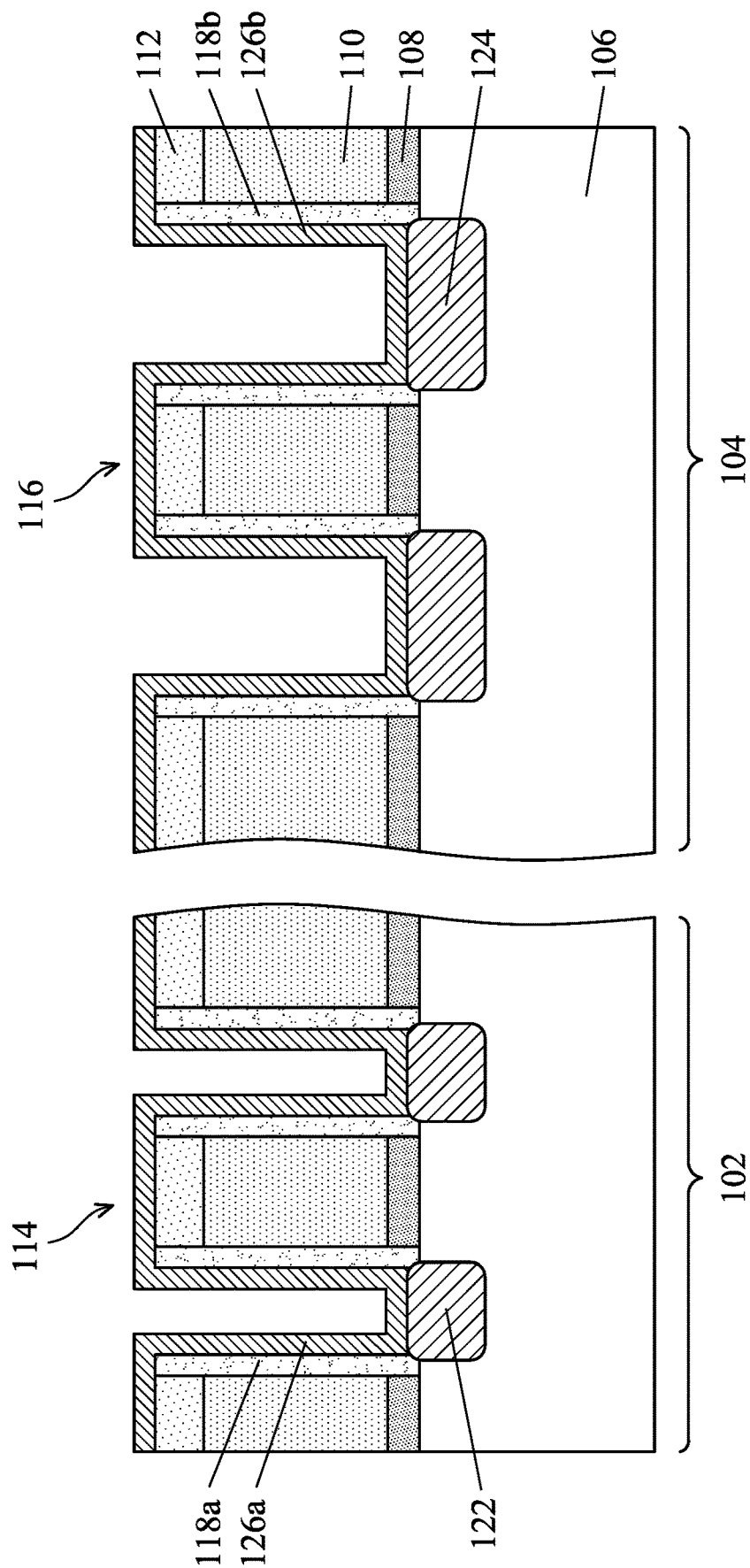

As shown in FIG. 15, CESL 126, including CESL 126a and CESL 126b, is conformally formed over first dummy gate structures 114, second dummy gate structures 116, spacer layer 118a, spacer layer 118b, first source/drain feature 122, and second source/drain feature 124. CESL 126a in first region 102 and CESL 126b in second region 104 are formed by the same process. In some embodiments, CESL 126a in first region 102 and CESL 126b in second region 104 may substantially have the same thickness.

Figure 16:
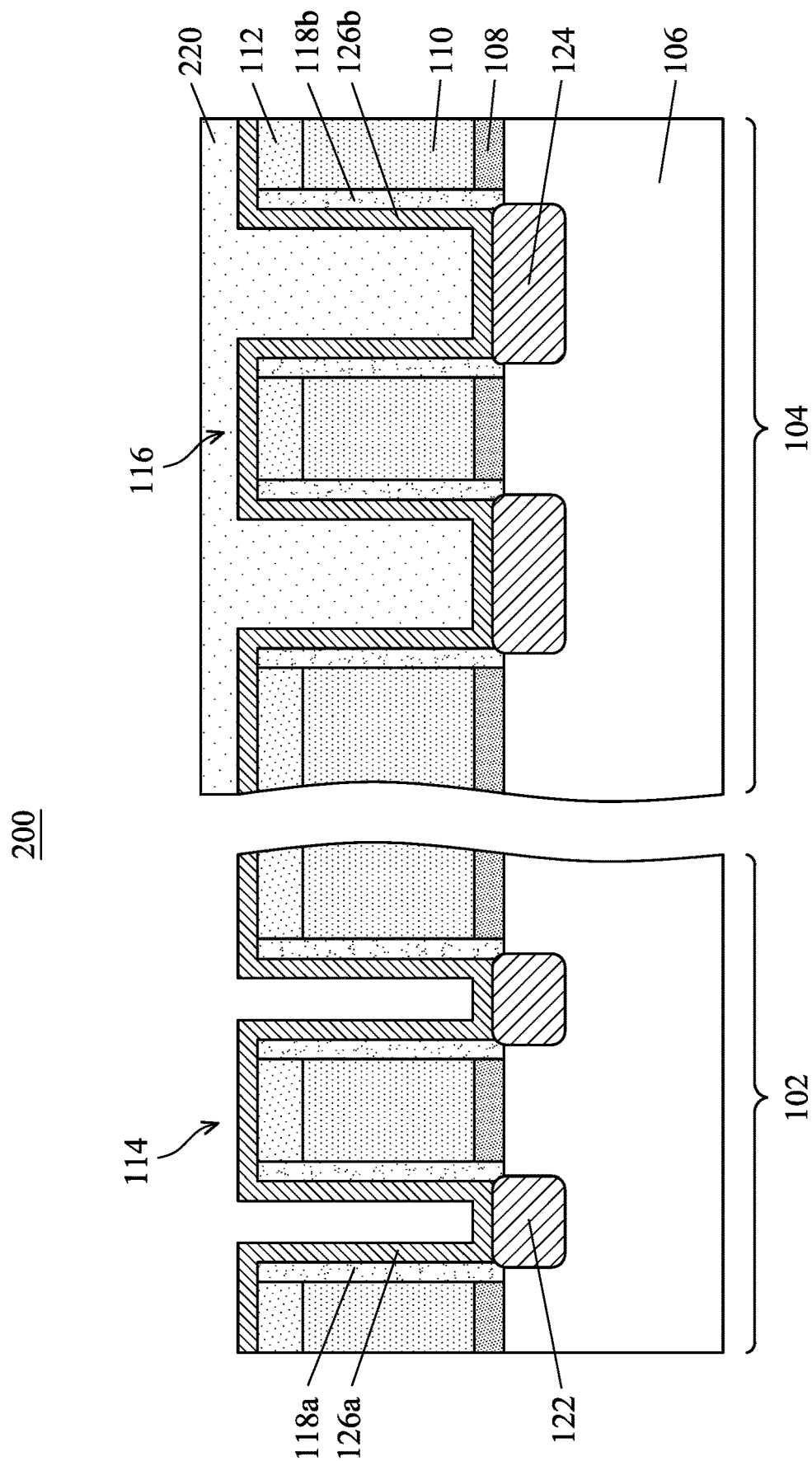
Figure 17:
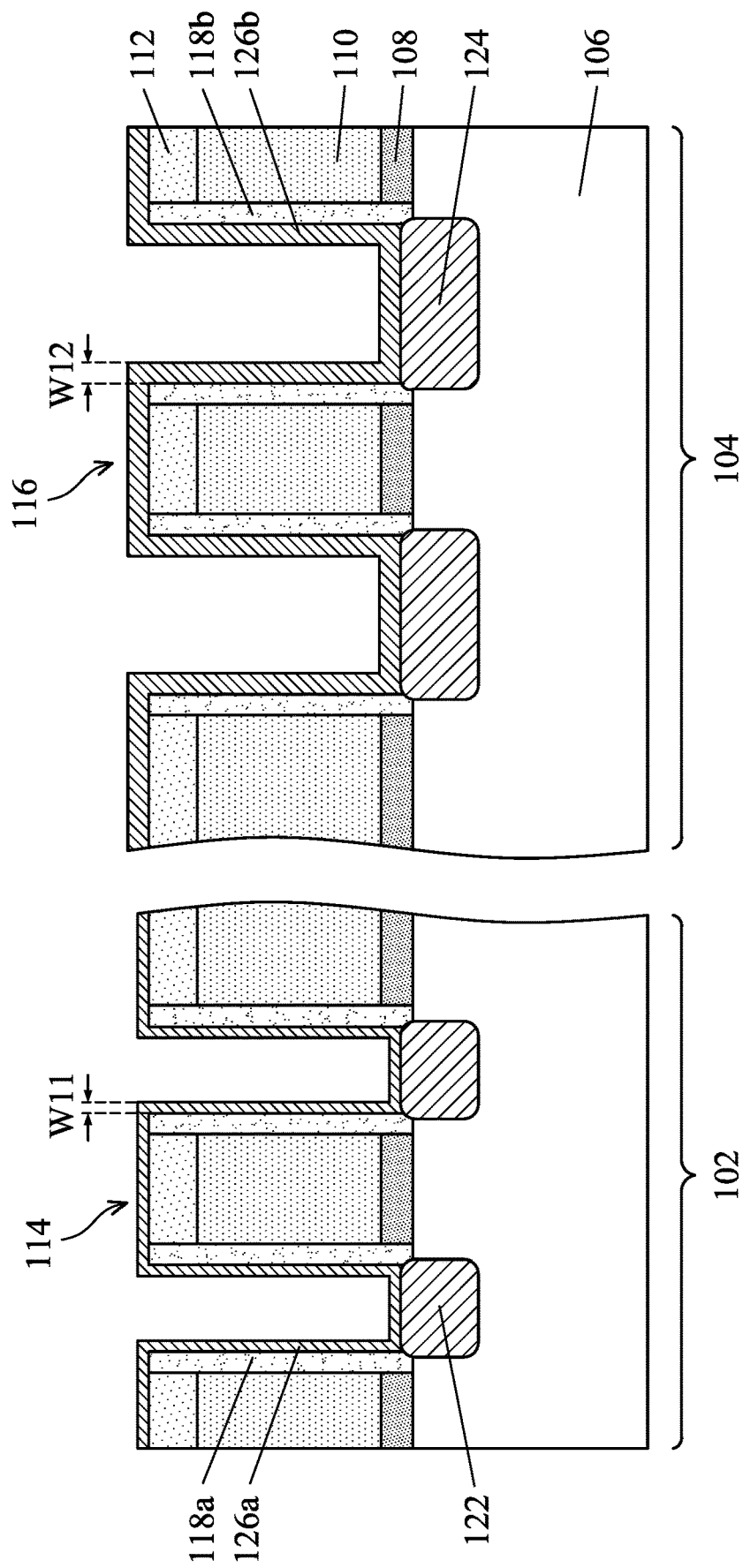

As shown in FIG. 16, a protection layer 220 is formed over CESL 126b in second region 104. In some embodiments, protection layer 220 may be a photoresist or other suitable materials that can protect CESL 126b during the etch process. Then, as shown in FIG. 17, an etch operation is performed on CESL 126a. Since CESL 126b in second region 104 is covered by protection layer 220, only CESL 126a in first region 102 is thinned. The thinning operation of CESL 126a may be performed by dry etch, wet etch, or other suitable processes.

As shown in FIG. 17, protection layer 220 is removed. CESL 126a in first region 102 has a thickness W12, and CESL 126b in second region 104 has a thickness W13. W12 is less than W13. By covering or uncovering CESL 126b in different regions of semiconductor structure 200 and performing the thinning operation, the thickness of CESL 126a can be controlled to achieve the predetermined parasitic resistance and/or parasitic capacitance of different devices formed on different regions of semiconductor structure 200.

Figure 18:
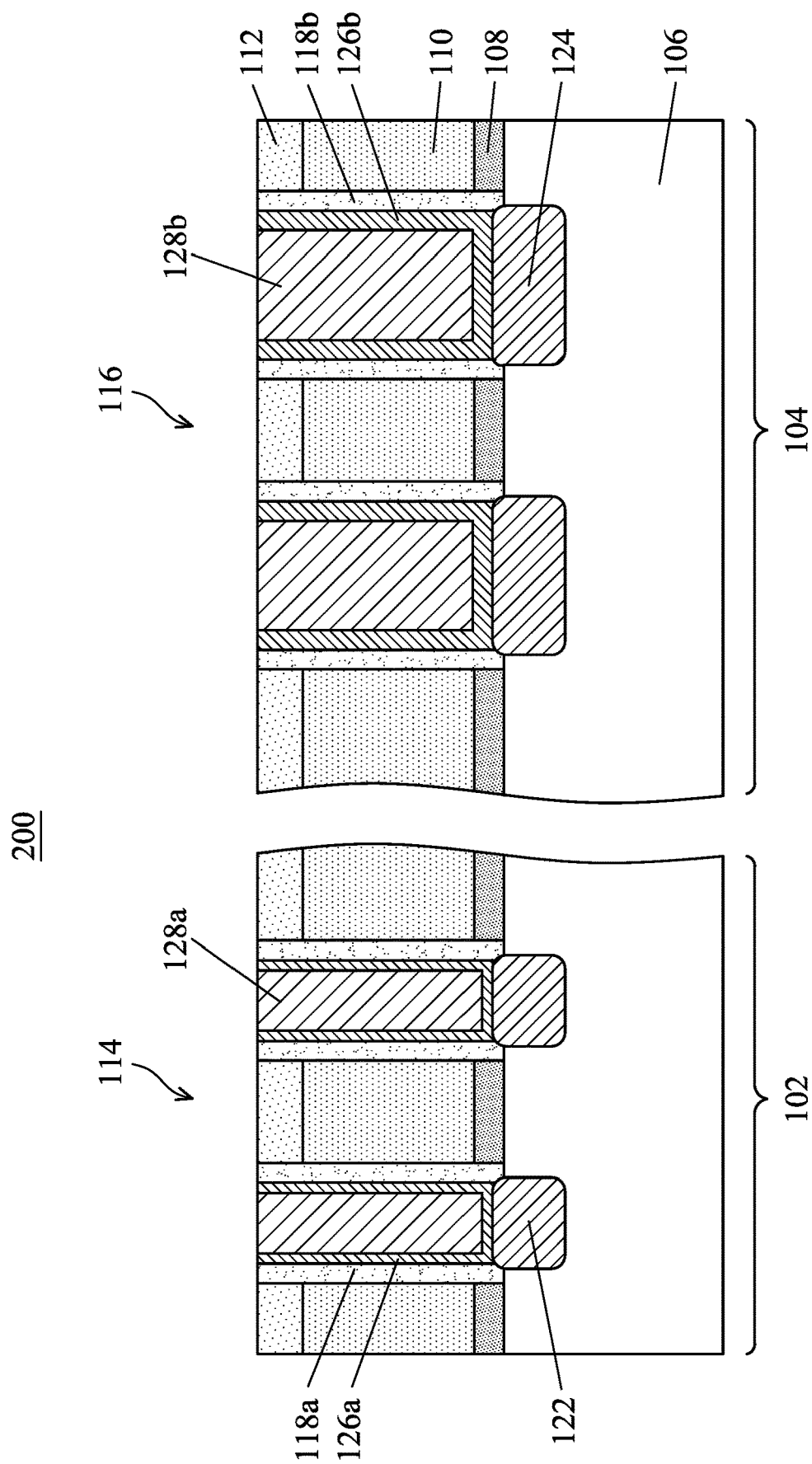
Figure 19:
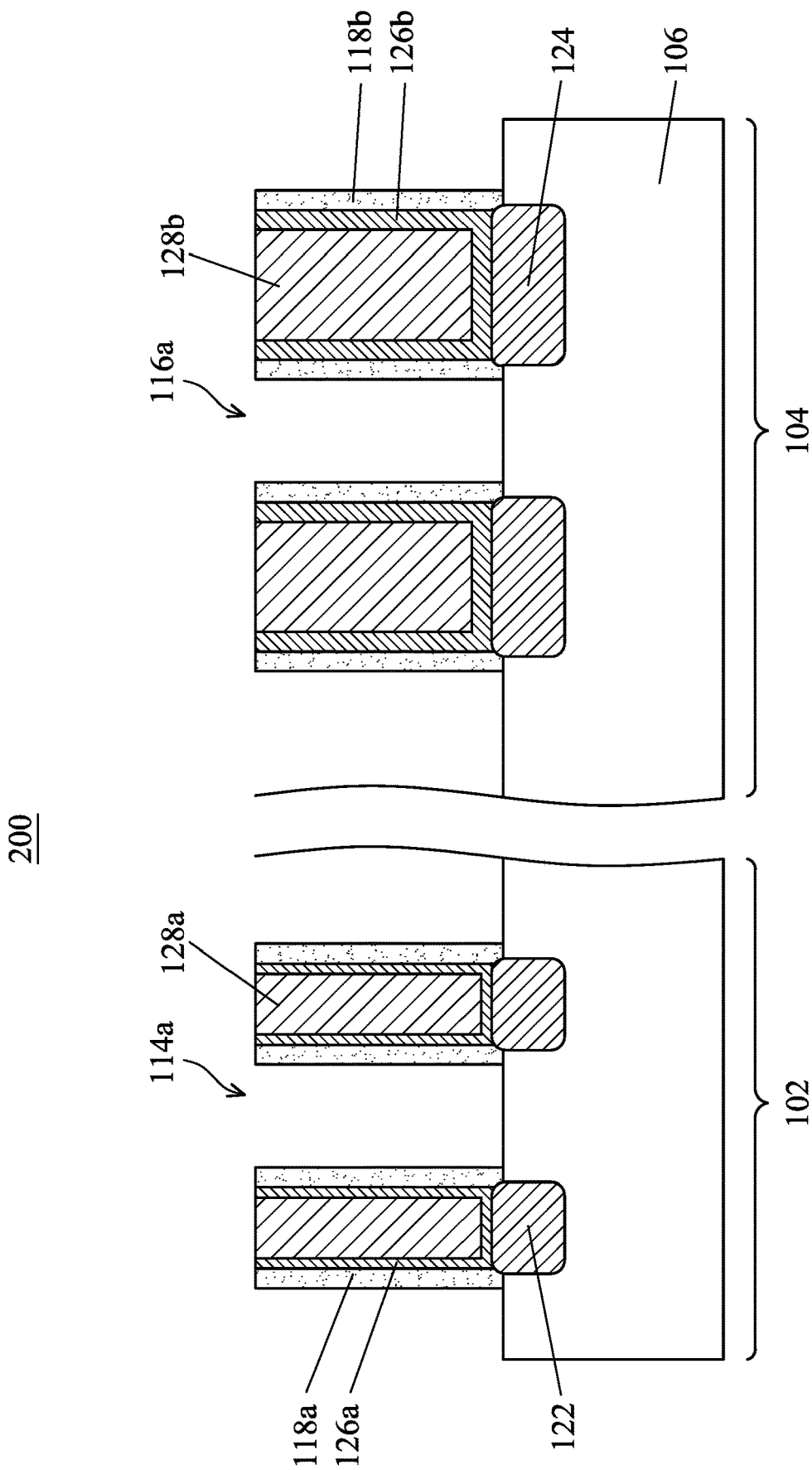

Then, as shown in FIG. 18, ILD 128 is deposited over CESL 126, including CESL 126a and CESL 126b, and a planarization process is performed to remove the top portions of ILD 128 to form ILD 128a in first region 102 and ILD 128b in second region 104. As shown in FIG. 19, first dummy gate structures 114 and second dummy gate structures 116 are removed. Dummy gate dielectric layer 108 and dummy gate electrode layer 110 may be removed in one or multiple etch operations, so that recesses 114a and 116a are formed. Each recess 114a or 116a exposes a channel region of a respective FET in the disclosure where MOSFETs are being formed. Each channel region is disposed between neighboring pairs of first source/drain feature 122 and second source/drain feature 124.

Figure 20:
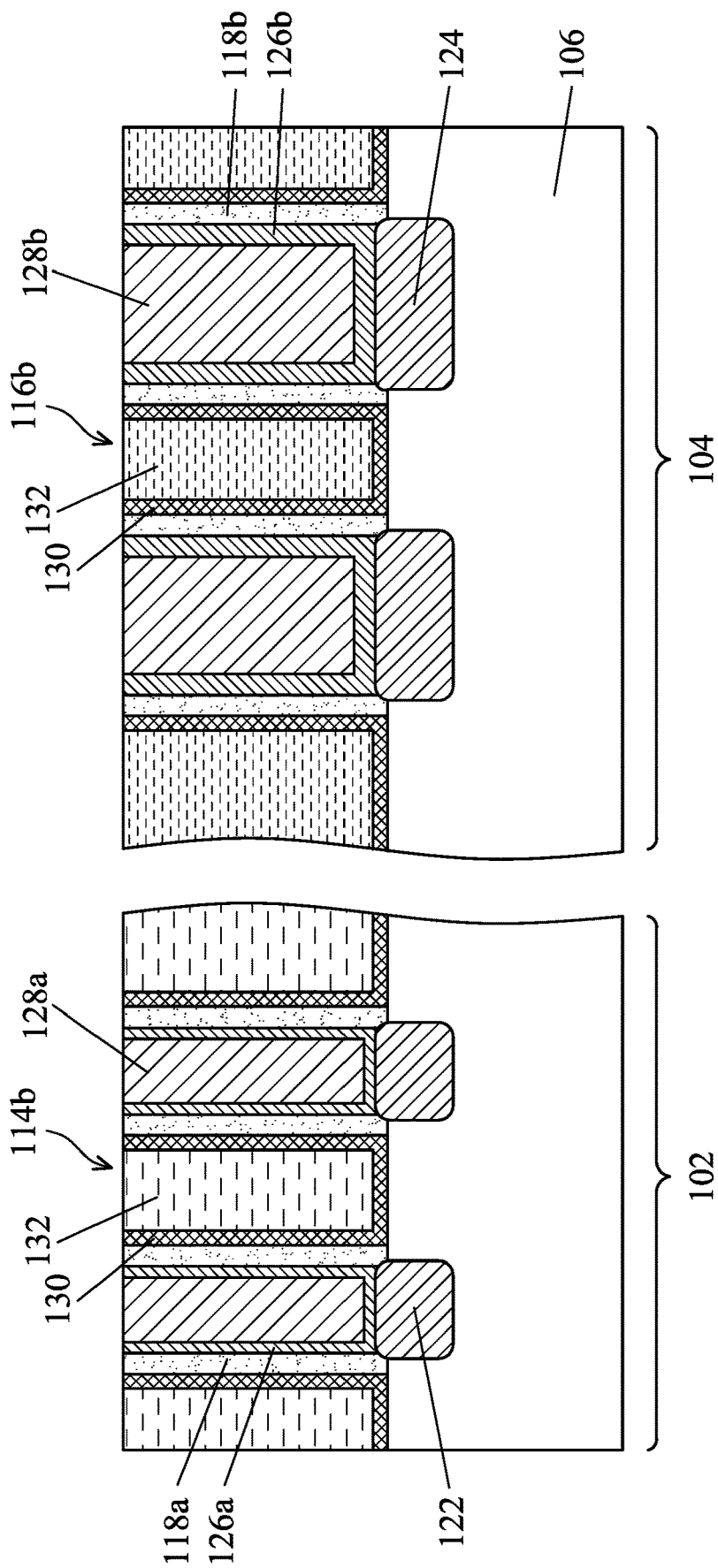

As shown in FIG. 20, first gate structures 114b and second gate structures 116b are formed in recesses 114a and 116a. Gate dielectric layers 130 and gate electrodes 132 are formed for replacement gates. Gate dielectric layers 130 are deposited conformally in recesses 114a and 116a, such as on the top surface of substrate 106 and on sidewalls of spacer layers 118a and 118b, and on a top surface of ILD 128a and ILD 128b. Then, gate electrodes 132 are deposited over gate dielectric layers 130, and fill the remaining portions of recesses 114a and 116a. After the filling of gate electrodes 132, a planarization process, such as a CMP process, may be performed to remove the top portions of gate dielectric layers 130 and gate electrodes 132, which excess over the top surface of ILD 128a and 128b.

Figure 21:
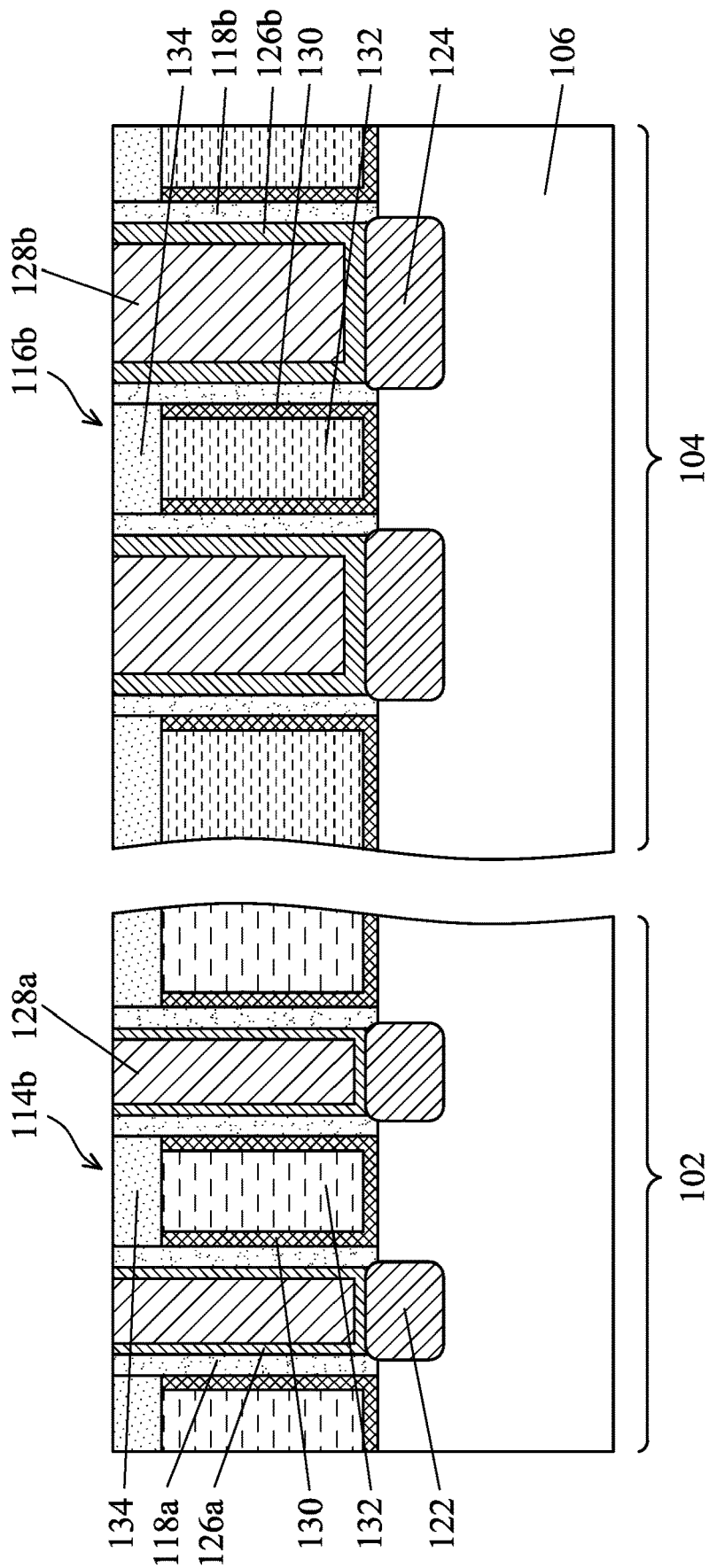

As shown in FIG. 21, hard mask layer 134 is formed on each of first gate structures 114b and second gate structures 116b. Hard mask layer 134 provides protection for first gate structures 114b and second gate structures 116b during the subsequent self-aligned contact etching processes to ensure that the self-aligned contact does not form a short circuit between one of first gate structures 114b and second gate structures 116b and the corresponding first source/drain feature 122 or second source/drain feature 124.

Figure 22:
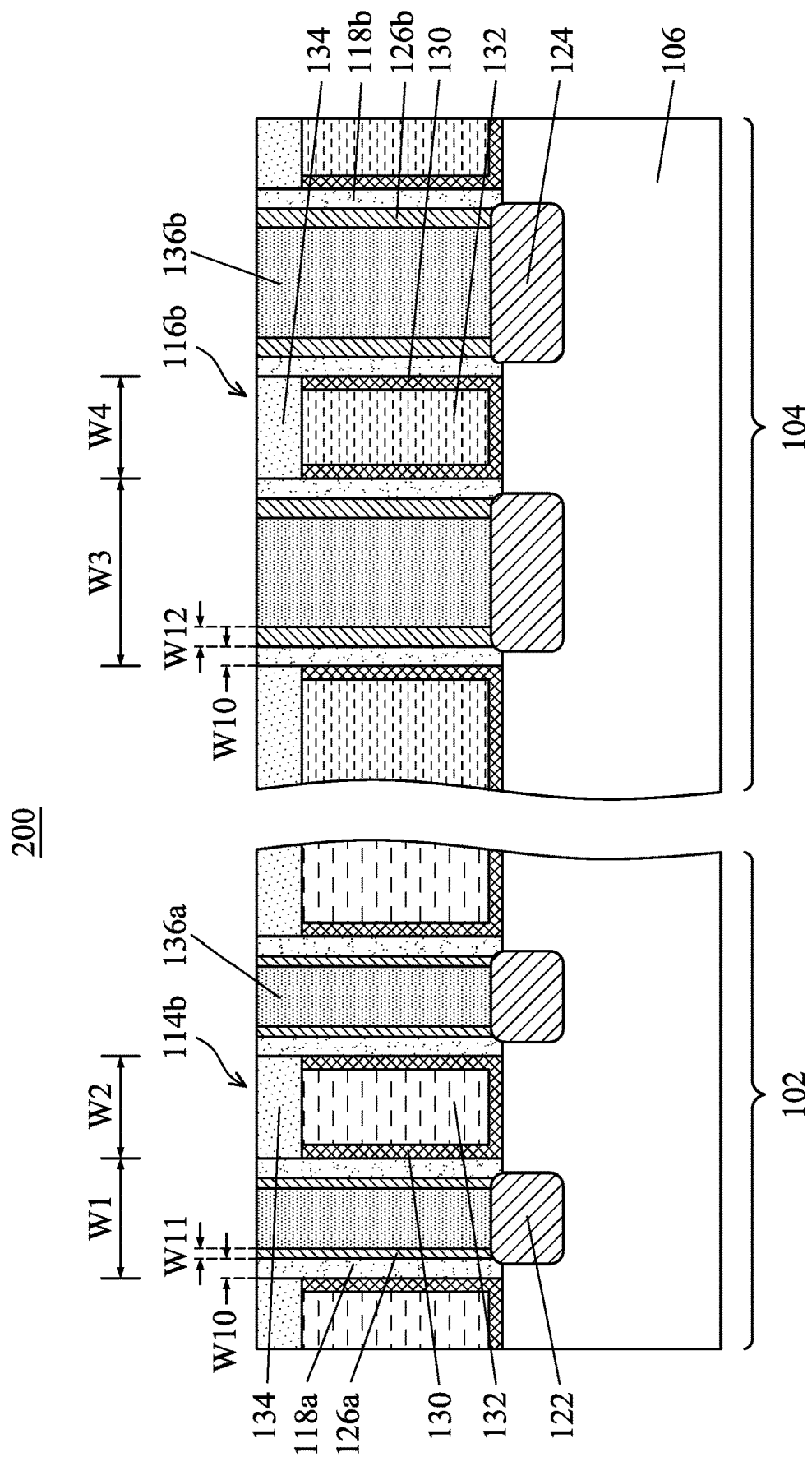

As shown in FIG. 22, ILD 128a and ILD 128b are then replaced by first conductive features 136a and second conductive features 136b. FIG. 22 illustrates the thickness relationship of various layer in first region 102 and second region 104 of semiconductor structure 200. First region 102 and second region 104 are defined to form active and/or passive devices, such as transistors, capacitors, resistors, combinations of these, and the like that may be used to generate the structural and functional requirements of the semiconductor device. For example, first region 102 may be used for fabricating transistors for SOC devices and second region 104 may be used for fabricating transistors for HPC devices. The width of first gate structure 114b is W2 and the width of second gate structure 116b is W4, which are defined by the width of first dummy gate structures 114 and second dummy gate structures 116, as shown in FIG. 2. In some embodiments, W2 is substantially equal to W4.

Spacer layer 118a in first region 102 and spacer layer 118b in second region 104 are formed during the same process, therefore the thickness of spacer layer 118a and spacer layer 118b are substantially the same, which is W10. CESL 126a in first region 102 has a thickness W11, and CESL 126b in second region 104 has a thickness W12. Since CESL 126a has been performed a thinning operation, the thickness of CESL 126a (W11) is less than the thickness of CESL 126b (W12).

Gap W1 between adjacent first gate structures 114b is less than gap W3 between adjacent second gate structures 116b. In some embodiments, W1 is about 60% to about 90% of W3 based on different devices fabricated in first region 102 and second region 104 on the same substrate 106. In some embodiments, W1 is about 65% to about 80% of W3.

The width of the source/drain contacts, e.g., first conductive features 136a and second conductive features 136b, may be defined by the gap between adjacent gate structures and the insulation layers, e.g., spacer layer 118a, spacer layer 118b, CESL 126a and CESL 126b. For example, the width of first conductive features 136a may be substantially equal to (W1−2*(W10+W11)), and the width of second conductive features 136b may be substantially equal to (W3−2*(W10+W12)). In some embodiments, the devices formed in first region 102 may need to reduce the parasitic resistance and increase the parasitic capacitance between first gate structure 114b and first conductive features 136a, comparing to the parasitic resistance and the parasitic capacitance between second gate structure 116b and second conductive features 136b. For example, when SOC devices are formed in first region 102 and HPC devices are formed in second region 104, a characteristic of low parasitic resistance and high parasitic capacitance between first gate structure 114b and first conductive features 136a may be beneficial.

By covering CESL 126b in second region and thinning CESL 126a in first region 102, the thickness W11 of CESL 126a can be controlled less than the thickness W12 of CESL 126b. Hence, the total thickness of the insulation layer in first region 102, including spacer layer 118a and CESL 126a, could be controlled thinner than the total thickness of the insulation layer in second region 104, including spacer layer 118b and CESL 126b. The parasitic resistance between first gate structure 114b and first conductive features 136a is therefore less than the parasitic resistance between second gate structure 116b and second conductive features 136b, and the parasitic capacitance between first gate structure 114b and first conductive features 136a is therefore higher than the parasitic capacitance between second gate structure 116b and second conductive features 136b.

When first gate structure 114b and second gate structure 116b include the SAC, such as hard mask layer 134, the devices having different critical dimensions can be formed at the same time to have the insulation layers with different thickness. Hence, the parasitic resistance and parasitic capacitance between devices using SAC process could be optimized, and the devices having large process window is not limited to compromise with the devices having small process window.

Figure 23:
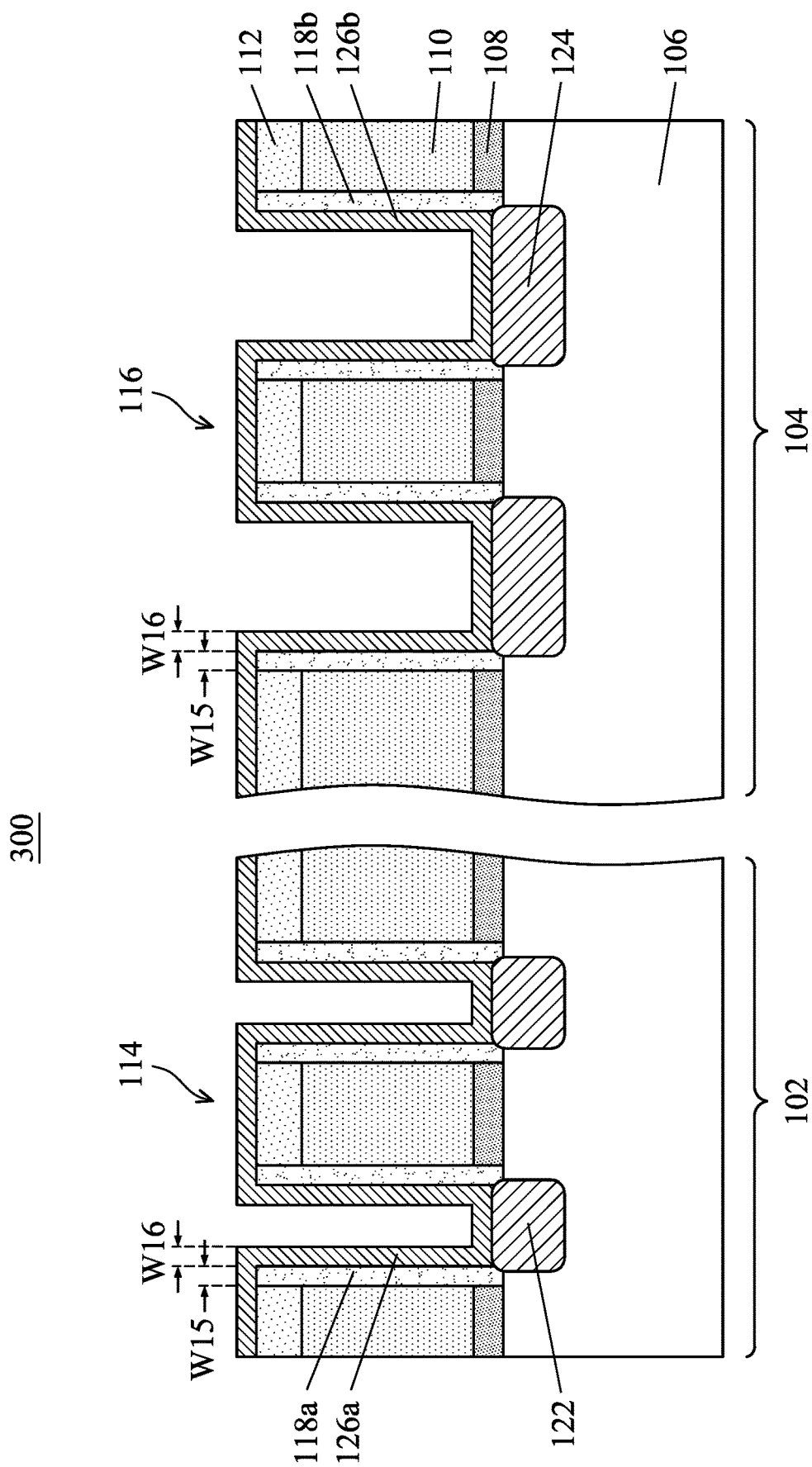
FIGS. 23-26 are cross-sectional side views of various stages of manufacturing a further semiconductor structure, in accordance with some embodiments.

FIGS. 23-26 are cross-sectional side views of various stages of manufacturing a further semiconductor structure 300, in accordance with some embodiments. Semiconductor structure 300 is similar to semiconductor structure 200. The structure shown in FIG. 23 is similar to the structure shown in FIG. 15, and the processes for forming the structures shown in FIG. 23 may be similar to the operations forming the structure shown in FIG. 15. Semiconductor structure 300 may be applied to some situations that the devices formed in first region 102 may need to increase the parasitic resistance and decrease the parasitic capacitance between first gate structure 114b and first conductive features 136a, comparing to the parasitic resistance and the parasitic capacitance between second gate structure 116b and second conductive features 136b.

The thickness of spacer layer 118a is W15, and the thickness of spacer layer 118b may be substantially equal to W15. As shown in FIG. 23, CESL 126, including CESL 126a and CESL 126b, is conformally formed over first dummy gate structures 114, second dummy gate structures 116, spacer layer 118a, spacer layer 118b, first source/drain feature 122, and second source/drain feature 124. CESL 126a in first region 102 and CESL 126b in second region 104 are formed by the same process. In some embodiments, CESL 126a in first region 102 and CESL 126b in second region 104 may substantially have the same thickness W16.

Figure 24:
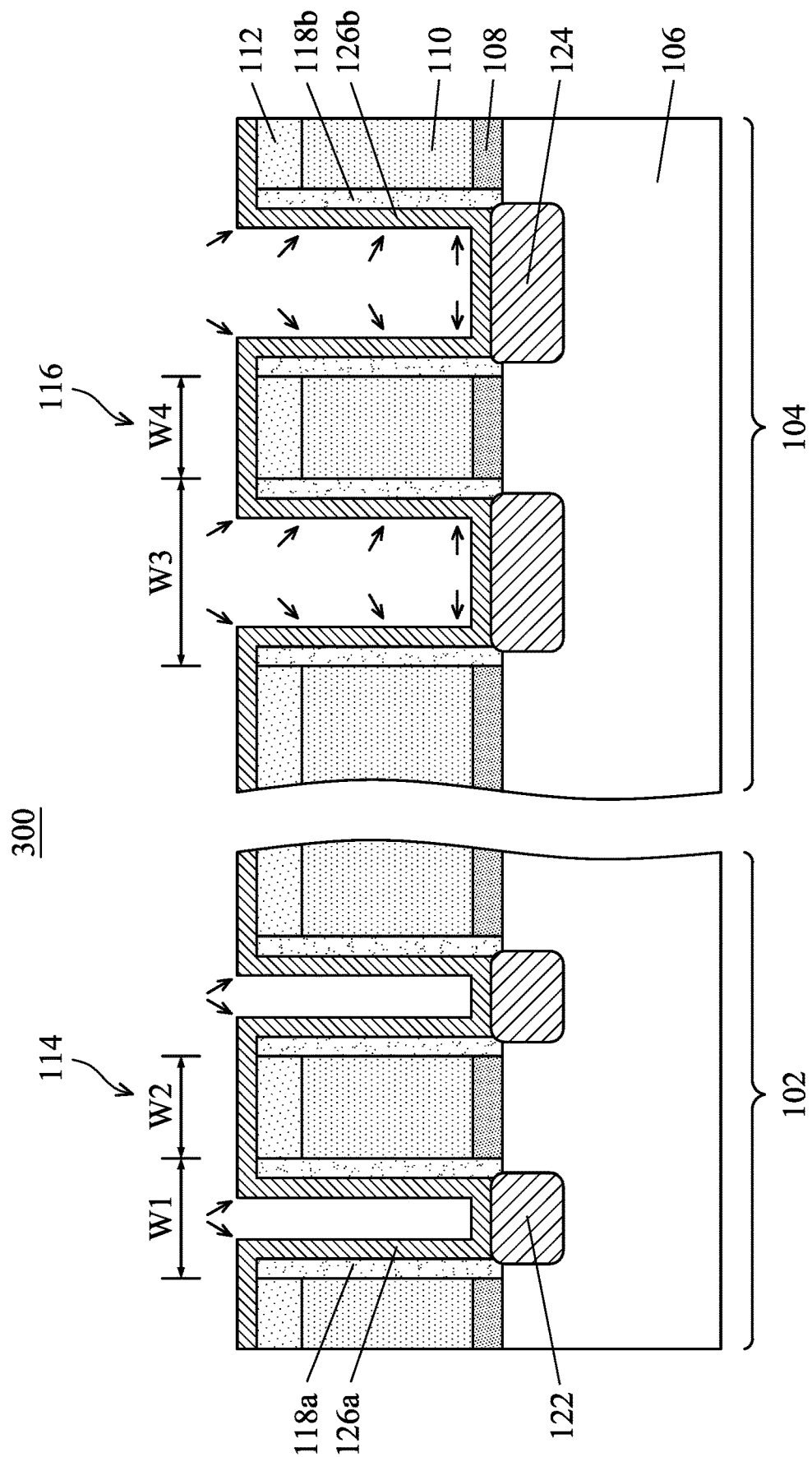
Figure 25:
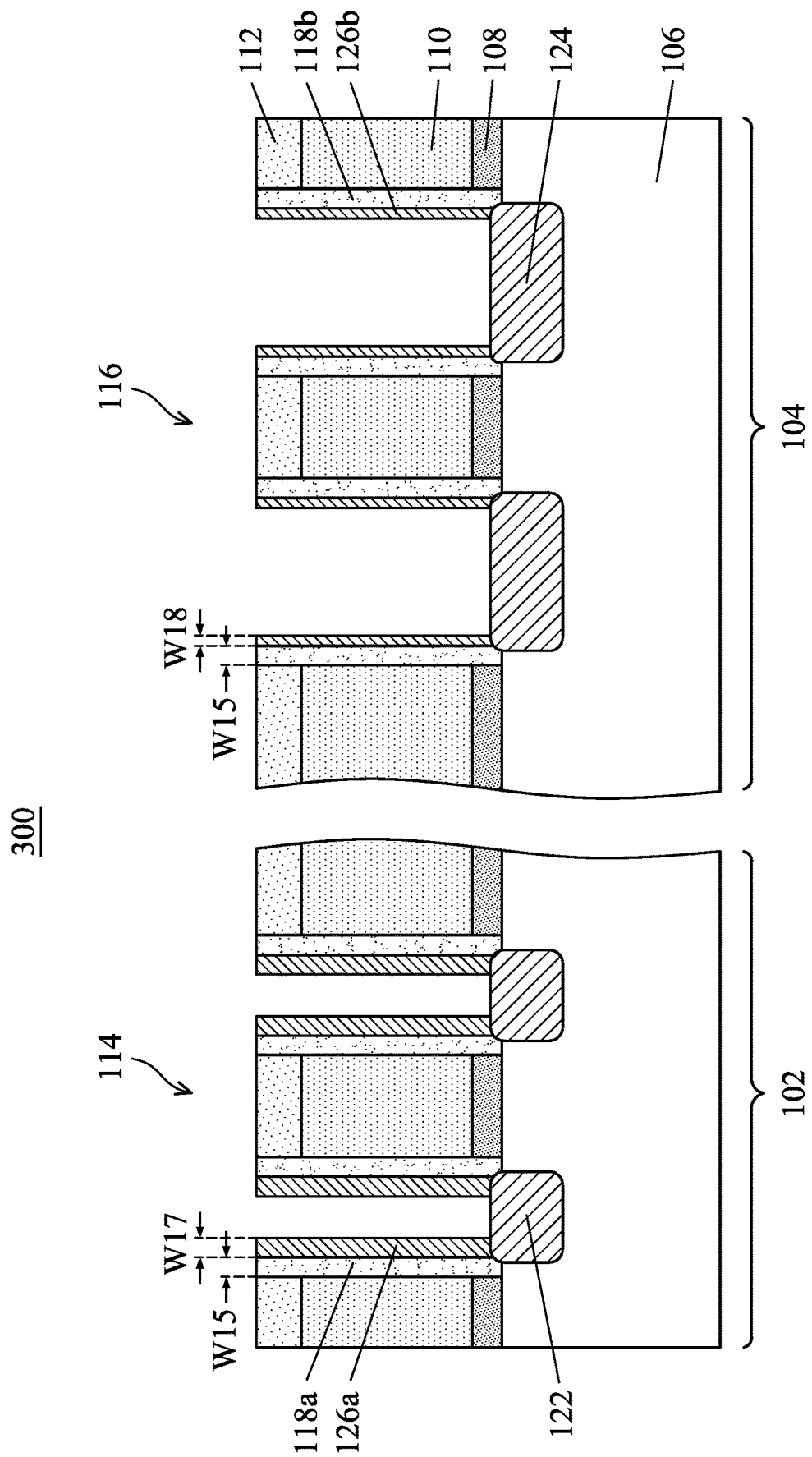

As shown in FIG. 24, an etch operation is performed on semiconductor structure 300 to remove portions of CESL 126a in first region 102 and CESL 126b in second region 104. Because gap W1 between two adjacent first dummy gate structures 114 is less than gap W3 between two adjacent second dummy gate structures 116, when performing the dry etch operation, the etching gas may have a higher etching rate in the opening between two adjacent second dummy gate structures 116. Therefore, after the etch operation, as shown in FIG. 25, CESL 126a in first region 102 may have a thickness W17, CESL 126b in second region 104 may have a thickness W18 less than W17.

Figure 26:
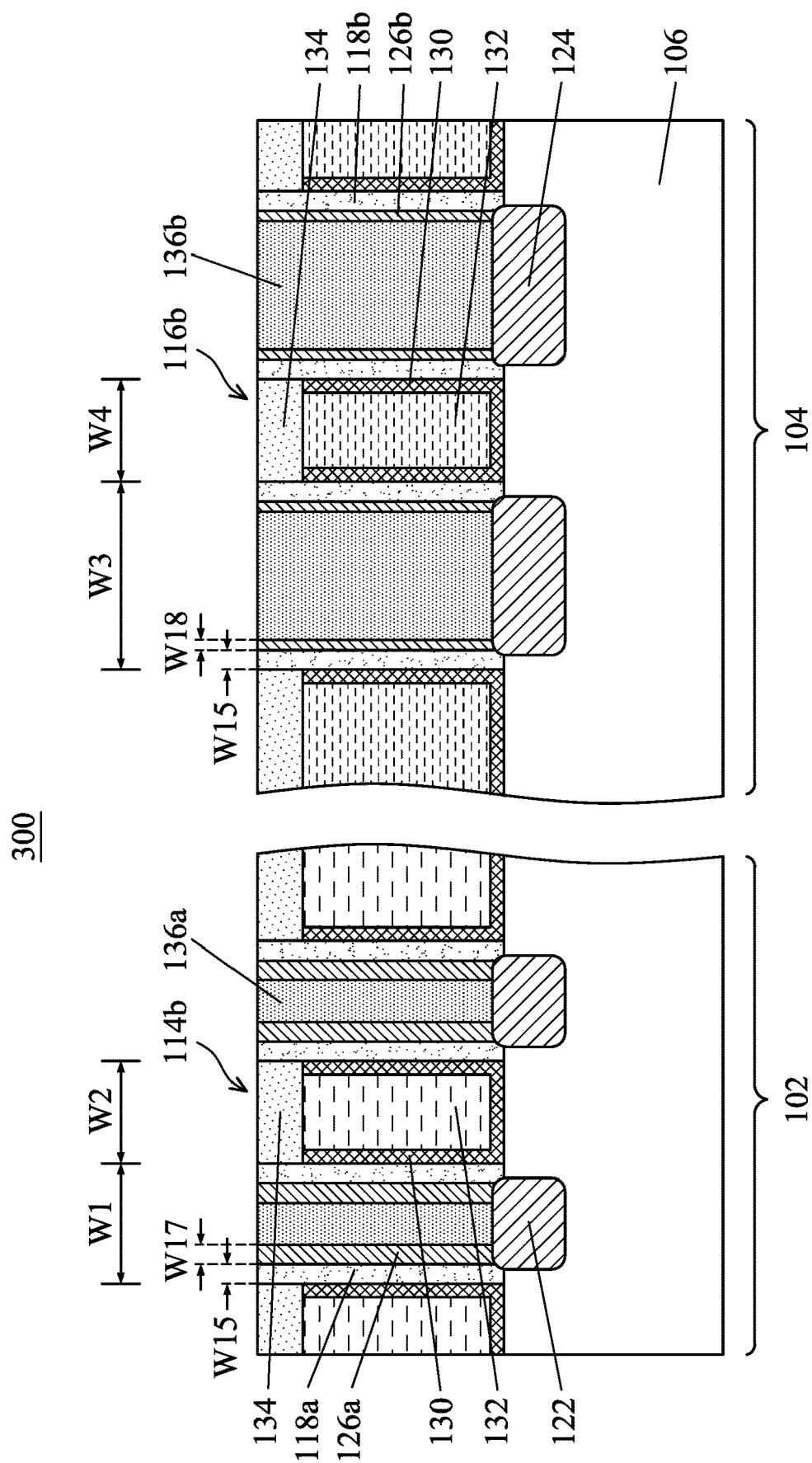

Then, first dummy gate structures 114 and second dummy gate structures 116 may be replaced by first gate structures 114b and second gate structures 116b. First conductive features 136a and second conductive features 136b 136a may be formed on first source/drain feature 122 and second source/drain feature 124, as shown in FIG. 26. The width of first gate structure 114b is W2 and the width of second gate structure 116b is W4, which are defined by the width of first dummy gate structures 114 and second dummy gate structures 116, as shown in FIG. 2. In some embodiments, W2 is substantially equal to W4.

Spacer layer 118a in first region 102 and spacer layer 118b in second region 104 are formed during the same process, therefore the thickness of spacer layer 118a and spacer layer 118b are substantially the same, which is W15. CESL 126a in first region 102 has a thickness W17, and CESL 126b in second region 104 has a thickness W18 less than W17 due to the thinning operation (e.g., etch operation) performed on the CESL 126b.

Gap W1 between adjacent first gate structures 114b is less than gap W3 between adjacent second gate structures 116b. In some embodiments, W1 is about 60% to about 90% of W3, which may vary depending on different devices fabricated in first region 102 and second region 104 on the same substrate 106. In some embodiments, W1 is about 65% to about 80% of W3.

The width of first conductive features 136a may be substantially equal to (W1−2*(W15+W17)), and the width of second conductive features 136b may be substantially equal to (W3−2*(W15+W17)). In some embodiments, the devices formed in first region 102 may need to increase the parasitic resistance and decrease the parasitic capacitance between first gate structure 114b and first conductive features 136a, comparing to the parasitic resistance and the parasitic capacitance between second gate structure 116b and second conductive features 136b. This embodiment could meet the requirement by thinning CESL 126b.

Figure 27:
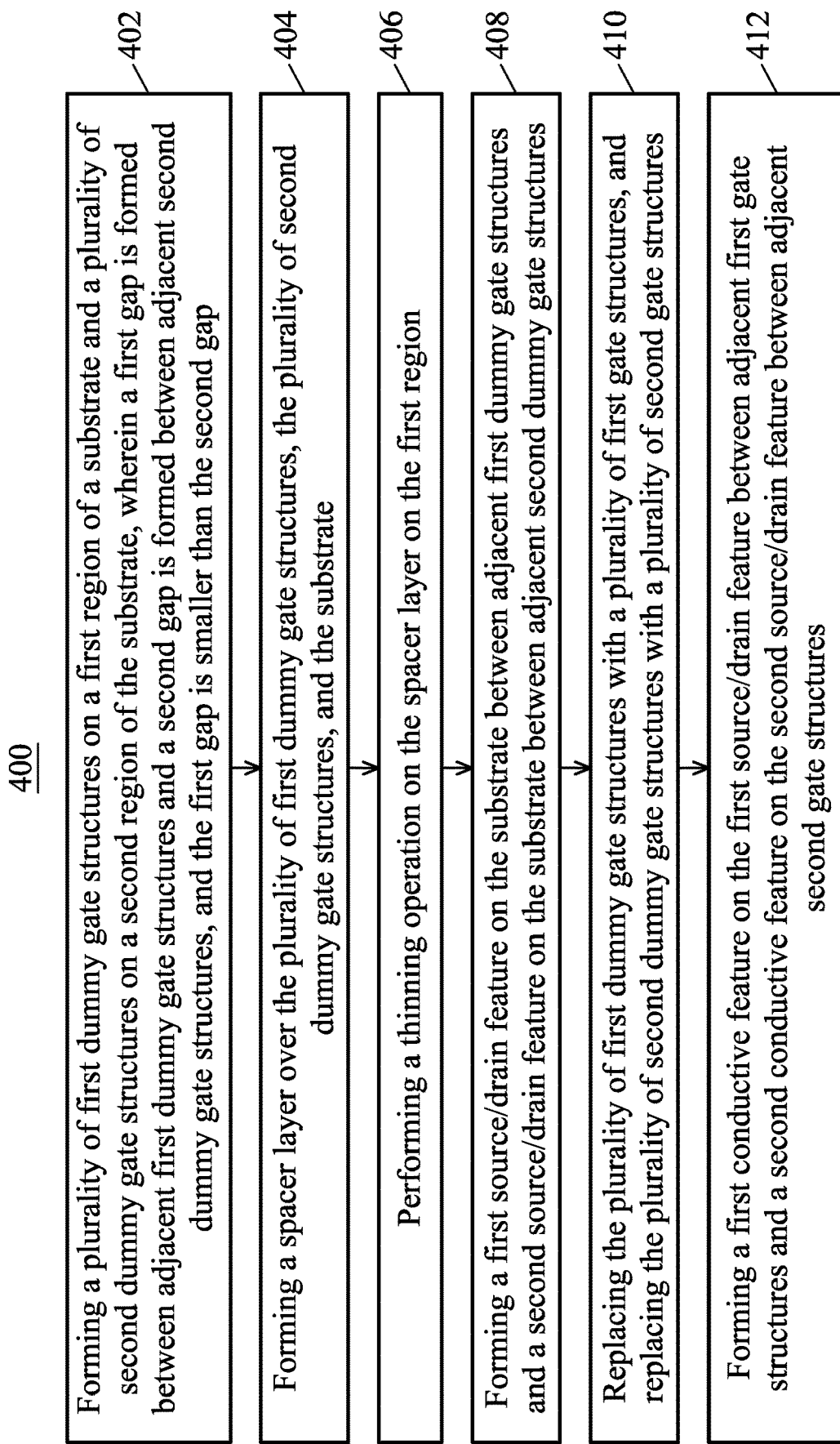
FIG. 27 is a flow chart of a method of manufacturing a semiconductor structure in accordance with some embodiments.

FIG. 27 is a flow chart of a method 400 of manufacturing a semiconductor structure in accordance with some embodiments. During operation 402, first dummy gate structures 114 are formed on first region 102 of substrate 106 and second dummy gate structures 116 are formed on second region 104 of substrate 106. First gap W1 is formed between adjacent first dummy gate structures 114 and second gap W3 is formed between adjacent second dummy gate structures 116, and first gap W1 is smaller than second gap W3.

During operation 404, spacer layer 118 is formed over first dummy gate structures 114, second dummy gate structures 116, and substrate 106. Then, during operation 406, a thinning operation is performed on spacer layer 118 in first region 102. In some embodiments, the thinning operation may include removing a portion of spacer layer 118 in first region 102 so that the thickness W6 of spacer layer 118a in first region 102 is less than the thickness W7 of spacer layer 118b in second region 104.

During operation 408, first source/drain feature 122 is formed on substrate 106 between adjacent first dummy gate structures 114 and second source/drain feature 124 is formed on substrate 106 between adjacent second dummy gate structures 116. Portions of spacer layers 118a and 118b on substrate 106, on first dummy gate structures 114, and on second dummy gate structures 116 are removed. Spacer layer 118a on sidewalls of the first gap is thinner than spacer layer 118b on sidewalls of the second gap. Then, an ion implantation operation is performed to form lightly doped drain (LDD) regions in substrate 106 between adjacent first dummy gate structures 114 and between adjacent second dummy gate structures 116. CESL 126a and CESL 126b may be formed over first dummy gate structures 114, second dummy gate structures 116, spacer layers 118a and 118b, first source/drain feature 122, and second source/drain feature 124.

During operation 410, first dummy gate structures 114 may be replaced with first gate structures 114b, and second dummy gate structures 116 may be replaced with second gate structures 116b. First dielectric layer 128 is formed over first source/drain feature 122 between adjacent first dummy gate structures 114 and second source/drain feature 124 between adjacent second dummy gate structures 116. The width of first dielectric layer 128a formed between adjacent first dummy gate structures 114 is smaller than the width of first dielectric layer 128b formed between adjacent second dummy gate structures 116.

First dummy gate structures 114 and second dummy gate structures 116 are then removed, and first gate structures 114b and second gate structures 116b are formed on substrate 106. Furthermore, the top portions of first gate structures 114b and second gate structures 116b are removed, and hard mask layer 134 is formed on each of first gate structures 114b and second gate structures 116b.

During operation 412, first conductive feature 136a is formed on first source/drain feature 122 between adjacent first gate structures 114b and second conductive feature 136b is formed on the second source/drain feature 124 between adjacent second gate structures 116b. For forming first conductive feature 136a and second conductive feature 136b, a second dielectric layer, e.g., a ILD layer (not shown), may be first formed over first gate structures 114b, second gate structures 116b, first dielectric layers 128a and 128b, and spacer layers 118a and 118b. At least a portion of the second dielectric layer and first dielectric layers 128a and 128b are removed to expose first source/drain feature 122 and second source/drain feature 124. Then, first conductive feature 136a is formed on first source/drain feature 122 and second conductive feature 136b is formed on second source/drain feature 124.

Figure 28:
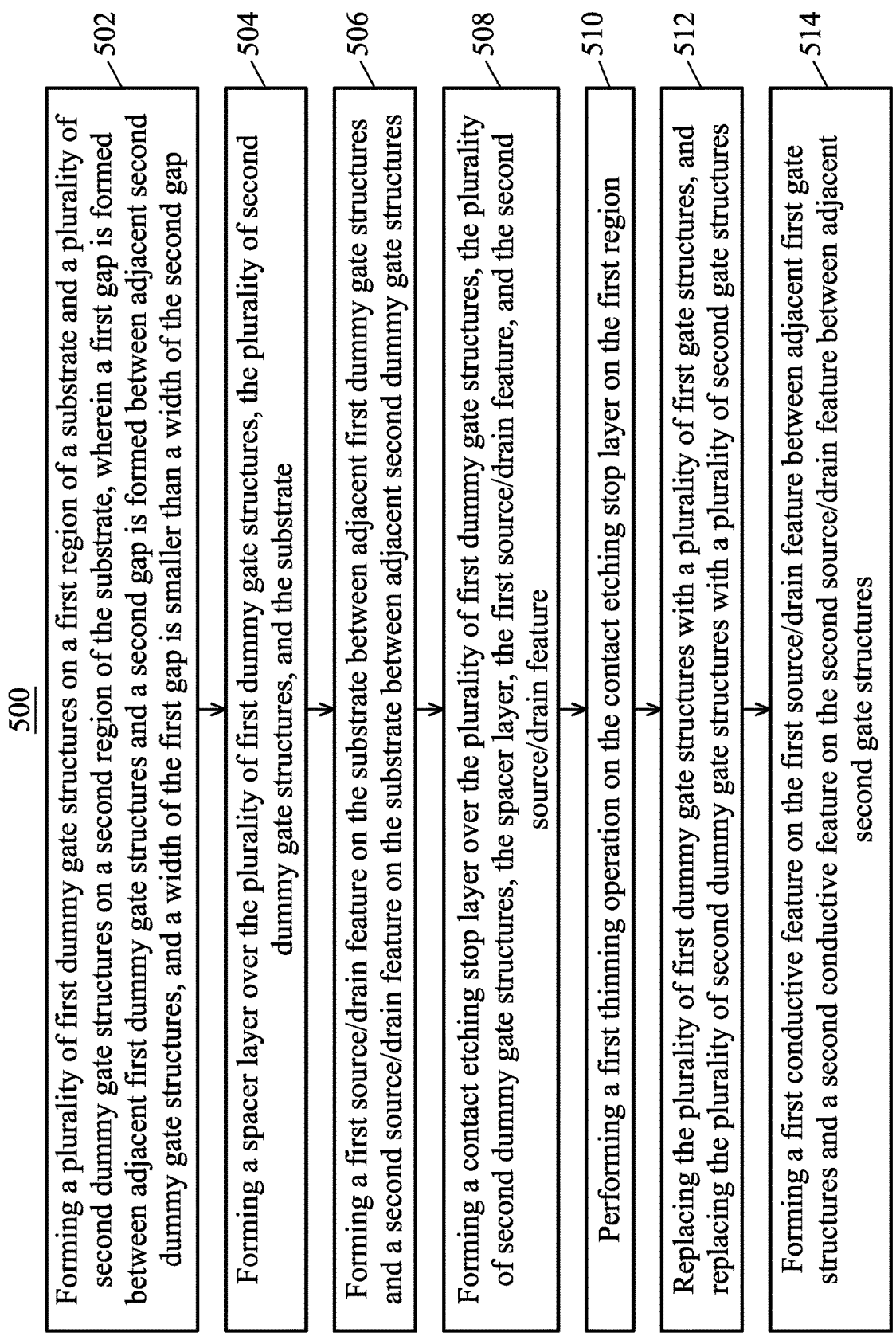
FIG. 28 is a flow chart of another method of manufacturing a semiconductor structure in accordance with some embodiments.

FIG. 28 is a flow chart of another method 500 of manufacturing a semiconductor structure in accordance with some embodiments.

During operation 502, first dummy gate structures 114 are formed on first region 102 of substrate 106 and second dummy gate structures 116 are formed on second region 104 of substrate 106. First gap W1 is formed between adjacent first dummy gate structures 114 and second gap W3 is formed between adjacent second dummy gate structures 116, and first gap W1 is smaller than second gap W3.

During operation 504, spacer layer 118 is formed over first dummy gate structures 114, second dummy gate structures 116, and substrate 106.

During operation 506, first source/drain feature 122 is formed on substrate 106 between adjacent first dummy gate structures 114 and second source/drain feature 124 is formed on substrate 106 between adjacent second dummy gate structures 116. Portions of spacer layers 118a and 118b on substrate 106, on first dummy gate structures 114, and on second dummy gate structures 116 are removed. Then, an ion implantation operation is performed to form lightly doped drain (LDD) regions in substrate 106 between adjacent first dummy gate structures 114 and between adjacent second dummy gate structures 116.

During operation 508, CESL 126a and CESL 126b may be formed over first dummy gate structures 114, second dummy gate structures 116, spacer layers 118a and 118b, first source/drain feature 122, and second source/drain feature 124.

During operation 510, a thinning operation may be performed on CESL 126a in first region 102. For performing the thinning operations, protection layer 220 may be first formed over CESL 126b in second region 104. Then, an etch operation is performed to remove a portion of CESL 126a in first region 102. After the etch operation, CESL 126a on sidewalls of the first gap is thinner than CESL 126b on sidewalls of the second gap.

During operation 512, first dummy gate structures 114 may be replaced with first gate structures 114b, and second dummy gate structures 116 may be replaced with second gate structures 116b. First dielectric layer 128 is formed over first source/drain feature 122 between adjacent first dummy gate structures 114 and second source/drain feature 124 between adjacent second dummy gate structures 116. The width of first dielectric layer 128a formed between adjacent first dummy gate structures 114 is smaller than the width of first dielectric layer 128b formed between adjacent second dummy gate structures 116.

First dummy gate structures 114 and second dummy gate structures 116 are then removed, and first gate structures 114b and second gate structures 116b are formed on substrate 106. Furthermore, the top portions of first gate structures 114b and second gate structures 116b are removed, and hard mask layer 134 is formed on each of first gate structures 114b and second gate structures 116b.

During operation 514, first conductive feature 136a is formed on first source/drain feature 122 between adjacent first gate structures 114b and second conductive feature 136b is formed on the second source/drain feature 124 between adjacent second gate structures 116b. For forming first conductive feature 136a and second conductive feature 136b, a second dielectric layer, e.g., a ILD layer (not shown), may be first formed over first gate structures 114b, second gate structures 116b, first dielectric layers 128a and 128b, and spacer layers 118a and 118b. At least a portion of the second dielectric layer and first dielectric layers 128a and 128b are removed to expose first source/drain feature 122 and second source/drain feature 124. Then, first conductive feature 136a is formed on first source/drain feature 122 and second conductive feature 136b is formed on second source/drain feature 124.

In the present disclosure, spacer layer 118 or CESL 126 may be optionally removed based on different devices located on different regions of the substrate, and therefore the thickness of spacer layer 118 or CESL 126 may be changed. By changing the total thickness of the insulation layer, including spacer layer 118 and CESL 126, the parasitic resistance and parasitic capacitance may be optimized between different predetermined devices formed on the same substrate. In addition, since first gate structure 114b and second gate structure 116b are formed in the same process, and first conductive feature 136a and second conductive feature 136b are formed in the same process, the process to form the insulation layers having different thicknesses in different regions of the same substrate may be further simplified. Furthermore, by removing portions of spacer layer 118 or CESL 126 to optimize the parasitic resistance and parasitic capacitance between devices having different critical dimensions, the devices having large process window is not limited to compromise with the devices having small process window.

An embodiment is a semiconductor structure. The semiconductor structure includes a first semiconductor device formed over a substrate. The first semiconductor device includes a first source/drain feature over the substrate, a first gate structure over the substrate, a first conductive feature over the first source/drain feature, and a first insulation layer between the first gate structure and the first conductive feature, wherein the first insulation layer comprises a first contact etching stop layer (CESL) in contact with the first source/drain feature. The semiconductor structure includes a second semiconductor device formed over the substrate, including a second source/drain feature over the substrate, a second gate structure over the substrate, a second conductive feature over the second source/drain feature, and a second insulation layer between the second gate structure and the second conductive feature, the second insulation layer comprises a second CESL in contact with the second source/drain feature, wherein a thickness of the first CESL is less than a thickness of the second CESL.

Another embodiment is a semiconductor structure. The semiconductor structure includes a first gate structure disposed between two first source/drain (S/D) contacts at a first device region over a substrate, wherein each first S/D contact has a first width, a second gate structure disposed between two second S/D contacts at a second device region over the substrate, wherein each second S/D contact has a second width greater than the first width, a first contact etching stop layer (CESL) disposed between the first gate structure and the first S/D contact, wherein the first CESL has a first thickness, and a second CESL disposed between the second gate structure and the second S/D contact, wherein the second CESL has a second thickness greater than the first thickness.

A further embodiment is a method for forming a semiconductor structure. The method includes forming a first source/drain (S/D) contact opening through a dummy gate structure at a first region over a substrate and a second S/D contact opening through the dummy gate structure at a second region over the substrate, wherein the first S/D contact opening exposes a first spacer layer and a first S/D feature in the first S/D contact opening, the second S/D contact opening exposes a second spacer layer and a second S/D feature in the second S/D contact opening, and wherein the first S/D contact opening has a first width and the second S/D contact opening has a second width greater than the first width. The method also includes forming a contact etching stop layer (CESL) on exposed surfaces of the first spacer layer, the first S/D feature, the second spacer layer, and the second S/D feature. The method also includes performing a thinning operation so that the CESL within the first S/D contact opening has a thickness less than a thickness of the CESL within the second S/D contact opening. The method also includes filling the first and second S/D contact openings with an interlayer dielectric (ILD), removing the dummy gate structure from the first and second regions, forming a first gate structure and a second gate structure respectively in regions formed as a result of the removal of the dummy gate structure at the first and second regions, and replacing the ILD in the first and second S/D contact openings with a conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure comprising:
   a first semiconductor device formed over a substrate comprising:
      a first source/drain feature over the substrate;
      a first gate structure over the substrate;
      a first conductive feature over the first source/drain feature; and
      a first insulation layer between the first gate structure and the first conductive feature, wherein the first insulation layer comprises a first contact etching stop layer (CESL) in contact with the first source/drain feature; and
   a second semiconductor device formed over the substrate comprising:
      a second source/drain feature over the substrate;
      a second gate structure over the substrate;
      a second conductive feature over the second source/drain feature; and
      a second insulation layer between the second gate structure and the second conductive feature, the second insulation layer comprises a second CESL in contact with the second source/drain feature,
   wherein a thickness of the first CESL is less than a thickness of the second CESL.

2. The semiconductor structure of claim 1, wherein the first CESL and the second CESL comprise the same material.

3. The semiconductor structure of claim 1, wherein the first CESL and the second CESL are formed on different regions of the substrate during the same process.

4. The semiconductor structure of claim 3, wherein the first conductive feature has a width less than a width of the second conductive feature.

5. The semiconductor structure of claim 3, wherein the first gate structure has a width that is substantially the same as a width of the second gate structure.

6. The semiconductor structure of claim 5, wherein the first insulation layer further comprises a first spacer layer disposed between the first CESL and the first gate structure, and the second insulation layer further comprises a second spacer layer disposed between the second CESL and the second gate structure.

7. The semiconductor structure of claim 6, wherein a thickness of the first spacer and a thickness of the second spacer is substantially the same.

8. A semiconductor structure comprising:
   a first gate structure disposed between two first source/drain (S/D) contacts at a first device region over a substrate, wherein each first S/D contact has a first width;
   a second gate structure disposed between two second S/D contacts at a second device region over the substrate, wherein each second S/D contact has a second width greater than the first width;
   a first contact etching stop layer (CESL) disposed between the first gate structure and the first S/D contact, wherein the first CESL has a first thickness; and
   a second CESL disposed between the second gate structure and the second S/D contact, wherein the second CESL has a second thickness greater than the first thickness.

9. The semiconductor structure of claim 8, further comprising:
   a first gate spacer layer disposed between the first CESL and the first gate structure, wherein the first gate spacer layer has a first thickness; and
   a second gate spacer layer disposed between the second CESL and the second gate structure, wherein the second gate spacer layer has a second thickness that is substantially equal to the first thickness of the first gate spacer.

10. The semiconductor structure of claim 9, wherein the first CESL is disposed between and in contact with the first S/D contact and the first gate spacer, and the second CESL is disposed between and in contact with the second S/D contact and the second gate spacer.

11. The semiconductor structure of claim 9, further comprising:
   a first S/D feature disposed below the first S/D contact, wherein the first S/D feature has a first width; and
   a second S/D feature disposed below the second S/D contact, wherein the second S/D feature has a second width greater than the first width of the first S/D feature.

12. The semiconductor structure of claim 8, wherein the first gate structure has a first width, and the second gate structure has a second width that is substantially equal to the first width of the first gate structure.

13. The semiconductor structure of claim 12, wherein the second width of the second S/D contact is greater than the second width of the second gate structure.

14. The semiconductor structure of claim 8, wherein the first device region comprises transistor for a system-on-chip (SOC) device and the second device region comprises transistors for high-performance-computing (HPC) devices.

15. A method for manufacturing a semiconductor structure, comprising:
   forming a first source/drain (S/D) contact opening through a dummy gate structure at a first region over a substrate and a second S/D contact opening through the dummy gate structure at a second region over the substrate, wherein the first S/D contact opening exposes a first spacer layer and a first S/D feature in the first S/D contact opening, the second S/D contact opening exposes a second spacer layer and a second S/D feature in the second S/D contact opening, and wherein the first S/D contact opening has a first width and the second S/D contact opening has a second width greater than the first width;

forming a contact etching stop layer (CESL) on exposed surfaces of the first spacer layer, the first S/D feature, the second spacer layer, and the second S/D feature;

performing a thinning operation so that the CESL within the first S/D contact opening has a thickness less than a thickness of the CESL within the second S/D contact opening;

filling the first and second S/D contact openings with an interlayer dielectric (ILD);

removing the dummy gate structure from the first and second regions;

forming a first gate structure and a second gate structure respectively in regions formed as a result of the removal of the dummy gate structure at the first and second regions; and replacing the ILD in the first and second S/D contact openings with a conductive feature.

16. The method of claim 15, wherein the conductive feature in the first S/D contact opening has a width that is less than a width of the conductive feature in the second S/D contact opening.

17. The method of claim 16, wherein the first gate structure and the second gate structure have the same gate width.

18. The method of claim 15, further comprising:
after forming the CESL and prior to performing the thinning operation, forming a protection layer over the CESL in second region.

19. The method of claim 15, wherein the second gate structure has a width less than the second width of the second S/D contact opening.

20. The method of claim 15, wherein the first region comprises transistor for a system-on-chip (SOC) device and the second region comprises transistors for high-performance-computing (HPC) devices.

* * * * *